US011189689B2

(12) United States Patent
Furuhashi et al.

(10) Patent No.: US 11,189,689 B2
(45) Date of Patent: Nov. 30, 2021

(54) SEMICONDUCTOR DEVICE INCLUDING AN ACTIVE REGION THAT INCLUDES A SWITCHABLE CURRENT PATH

(71) Applicant: Mitsubishi Electric Corporation, Tokyo (JP)

(72) Inventors: Masayuki Furuhashi, Tokyo (JP); Nobuo Fujiwara, Tokyo (JP); Naoyuki Kawabata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/634,167

(22) PCT Filed: Oct. 5, 2017

(86) PCT No.: PCT/JP2017/036213
§ 371 (c)(1),
(2) Date: Jan. 27, 2020

(87) PCT Pub. No.: WO2019/069416
PCT Pub. Date: Apr. 11, 2019

(65) Prior Publication Data
US 2020/0235203 A1    Jul. 23, 2020

(51) Int. Cl.
*H01L 29/06*    (2006.01)
*H01L 29/10*    (2006.01)
(Continued)

(52) U.S. Cl.
CPC ...... *H01L 29/0634* (2013.01); *H01L 29/1095* (2013.01); *H01L 29/1608* (2013.01); *H01L 29/7827* (2013.01)

(58) Field of Classification Search
CPC ............. H01L 29/0634; H01L 29/1095; H01L 29/1608; H01L 29/7827; H01L 29/417;
(Continued)

(56) References Cited

U.S. PATENT DOCUMENTS 6,081,009 A * 6/2000 Neilson ............... H01L 29/7802
257/341
6,849,880 B1 * 2/2005 Saito ................... H01L 29/0634
257/135
(Continued)

FOREIGN PATENT DOCUMENTS

JP    2008-091450 A    4/2008
JP    2008-258327 A    10/2008
(Continued)

OTHER PUBLICATIONS

International Search Report and Written Opinion dated Dec. 12, 2017 for PCT/JP2017/036213 filed on Oct. 5, 2017, 9 pages including English Translation of the International Search Report.

*Primary Examiner* — Mohammad M Hoque
(74) *Attorney, Agent, or Firm* — Xsensus LLP

(57) ABSTRACT

A superjunction layer includes first pillars of a first conductivity type and second pillars of a second conductivity type. First wells are provided respectively on the second pillars to reach the first pillars and are of the second conductivity type. First impurity regions are provided respectively on the first wells and are of the first conductivity type. Second wells are provided respectively on the first pillars, spaced from the second pillars in a section of an active region that is perpendicular to a semiconductor layer, and are of the second conductivity type. Second impurity regions are provided respectively on the second wells and are of the first conductivity type.

18 Claims, 33 Drawing Sheets

(51) Int. Cl.
*H01L 29/16* (2006.01)
*H01L 29/78* (2006.01)

(58) Field of Classification Search
CPC ............ H01L 29/7397; H01L 29/7395; H01L 29/7813; H01L 29/66068; H01L 29/0696; H01L 29/7802; H01L 21/3083; H01L 21/02
USPC .......................................................... 257/330
See application file for complete search history.

(56) References Cited

U.S. PATENT DOCUMENTS

| | | | |
|---|---|---|---|
| 7,859,048 B2* | 12/2010 | Kagata | ................ H01L 29/0634 257/330 |
| 2008/0237774 A1 | 10/2008 | Ono et al. | |
| 2008/0246085 A1 | 10/2008 | Saito et al. | |
| 2010/0032752 A1 | 2/2010 | Hozumi et al. | |
| 2012/0119288 A1 | 5/2012 | Hozumi et al. | |
| 2013/0029466 A1 | 1/2013 | Hozumi et al. | |
| 2014/0284711 A1 | 1/2014 | Foote et al. | |
| 2014/0084361 A1* | 3/2014 | Saito | ................... H01L 29/0878 257/329 |
| 2016/0035881 A1* | 2/2016 | Tamura | ............... H01L 29/1095 257/329 |
| 2017/0271442 A1 | 9/2017 | Uehara | |
| 2017/0294521 A1 | 10/2017 | Tamura et al. | |
| 2019/0386097 A1* | 12/2019 | Schillaci | ............. H01L 29/7811 |
| 2021/0057554 A1* | 2/2021 | Huang | ................ H01L 29/0696 |

FOREIGN PATENT DOCUMENTS

| | | |
|---|---|---|
| JP | 2010-040975 A | 2/2010 |
| JP | 2012-160752 A | 8/2012 |
| JP | 2014-187141 A | 10/2014 |
| JP | 2015-216182 A | 8/2015 |
| JP | 2017-168666 A | 9/2017 |
| WO | 2015/040938 A1 | 3/2015 |

* cited by examiner

F I G. 3 6
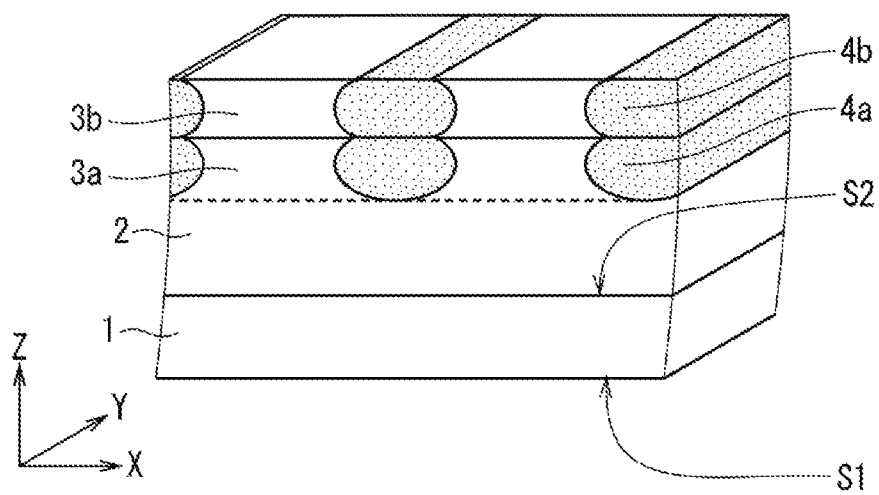

SEMICONDUCTOR DEVICE INCLUDING AN ACTIVE REGION THAT INCLUDES A SWITCHABLE CURRENT PATH

CROSS-REFERENCE TO RELATED APPLICATIONS

The present application is based on PCT filing PCT/JP2017/036213, filed Oct. 5, 2017, the entire contents of which are incorporated herein by reference.

TECHNICAL FIELD

The present invention relates to a semiconductor device and in particular to a semiconductor device having a superjunction structure.

BACKGROUND ART

Vertical devices having electrodes on opposite surfaces of a semiconductor substrate are in the mainstream of semiconductor devices used in power electronics. Typical examples thereof include metal oxide semiconductor field effect transistors (MOSFETs) and insulated gate bipolar transistors (IGBTs). When an ordinary vertical MOSFET is turned off, a depletion layer extends within a drift layer and functions as a withstand-voltage layer. If the drift layer has a small thickness or a high impurity concentration, the withstand voltage of the device will decrease because only a thin depletion layer can be formed. When the MOSFET is on, on the other hand, current flows through the semiconductor substrate and the drift layer, and a resistance acting on this current is referred to as an "on-resistance." The resistance of the drift layer, i.e., drift resistance, is higher than the resistance of the semiconductor substrate and is thus one of principal resistance components of the MOSFET. Therefore, the on-resistance can be reduced substantially by reducing the drift resistance. A typical method for achieving this is to reduce the thickness of the drift layer or to increase the impurity concentration in the drift layer. From the above, there is a tradeoff between high withstand voltage and low on-resistance.

As a structure capable of resolving this tradeoff between the withstand voltage and the on-resistance, a superjunction structure has been proposed. In the case of a superjunction structure, p-type pillars and n-type pillars are alternately aligned in a direction orthogonal to the direction of current flow in a drift layer. With this structure, depletion layers expand also from pn-junction faces between the p-type pillars and the n-type pillar, aside from depletion layers that expand from pn-junction faces or metal joining faces that exist in the vicinity of the surfaces of semiconductor elements. That is, depletion layers are formed to the same depth as the depths of the pillars in the drift layer. For example when the drift layer has an n-type conductivity, even if the impurity concentration in the n-type pillars is increased in order to reduce the drift resistance, it is possible to maintain a high withstand voltage by maintaining a balance between the impurity concentration in the n-type pillars and the impurity concentration in the p-type pillars such that these pillars become completely depleted. Accordingly, the superjunction structure is expected to provide a dramatic improvement in the tradeoff between the withstand voltage and the on-resistance in the semiconductor device.

Conceivable methods for forming the aforementioned pillars include a multi-epitaxial method that alternately repeats an epitaxial growth step and an ion implantation step, and an embedded epitaxial method for forming trenches in an epitaxial layer and then forming another epitaxial layer that is embedded in the trenches. In either method, there is a limit to the magnitudes of the aspect ratio of the pillar structure, and thus the width of the pillar structure increases with the depth of the pillar structure. The depth of the pillar structure is determined in consideration of a desired withstand voltage and a semiconducting material to be used. For example, to obtain a withstand voltage of 6500V with silicon carbide (SiC), p-type pillars with a depth of approximately 40 µm are thought to be necessary. The following considers a case where such p-type pillars are formed by an embedded epitaxial method.

First, an etching mask is formed so as to form trenches. If an oxide-film mask made of tetraethylorthosilicate (TEOS) is used, which is commonly used for SiC etching, the mask needs to have a thickness of approximately 10 µm in consideration of etch selectivity. In the case where a pattern of the oxide-film mask with this thickness is formed by dry etching, a resist mask with a thickness of approximately 6 µm is necessary. When considering the aspect ratio of openings that can be formed stably through the patterning of the resist mask, the width of the openings that are formed in the resist mask is approximately greater than or equal to 4 µm. The width dimension of the pattern will increase in the process of transferring the openings of the resist mask to the oxide-film mask and then to the SiC trenches by etching. Accordingly, the width of the p-type pillars that can be obtained stably is greater than or equal to 7 to 8 µm.

Although described in detail later, once the width of the p-type pillars has been determined, a combination of the width of the n-type pillars and the donor concentration in the n-type pillars is uniquely determined, which combination will minimize the drift resistance while maintaining the withstand voltage. This is because, since impurity concentration balancing between the p-type pillars and the n-type pillars is necessary as described above, the width of the n-type pillars and the donor concentration in the n-type pillars cannot be set independently. For example, when the p-type pillars has a width of approximately 8 µm, it is appropriate for the n-type pillars to have a width of approximately 4 µm in order to minimize the drift resistance. In this case, a total of the widths of a p-type pillar and an n-type pillar, i.e., a pillar pitch in the superjunction structure, is approximately 12 µm.

Ordinarily, in the case of producing a superjunction-structure MOSFET, it is common to dispose a single MOSFET cell within a single pillar pitch. In that case, the cell pitch in the MOSFET is the same as the pillar pitch in the superjunction structure, which is approximately 12 µm in the above-described example. In contrast, the cell pitch in an ordinary MOSFET that does not have a superjunction structure is approximately one-half of the aforementioned cell pitch. Thus, the cell pitch normally increases when a superjunction structure is applied. As a result, the channel width per unit area, i.e., the density along the channel width, decreases and the channel resistance increases correspondingly. In particular, when SiC is used as a semiconducting material, the carrier mobility in channels is extremely lower than the value expected from the carrier mobility in crystals due to a high interface state density at the $SiC/SiO_2$ interface. For this reason, the SiC-MOSFET has originally a high channel resistance. If the density along the channel width decreases as described above, the channel resistance will further increase. Consequently, even in the case of a high breakdown-voltage MOSFET having a relatively high drift resistance, the channel resistance becomes a primary component of the on-resistance.

Ordinary MOSFETs that do not have a superjunction structure often employ a structure (cell structure) in which unit cells, each having a polygonal pattern such a square or hexagonal pattern, are aligned periodically in order to increase the density along the channel width. On the other hand, MOSFETs having superjunction structures often avoid applying a complex cell structure and further complicating steps because of a high degree of difficulty in the step of forming a superjunction structure. Specifically, instead of using polygonal pattern shapes as described above, the MOSFETs often use simpler stripe shapes. Consequently, the density along the channel width will further decrease.

Japanese Patent Application Laid-Open No. 2010-040975 (Patent Document 1) intends to get proper performance from both of a superjunction structure and a vertical MOSFET by allowing the array pitch in the superjunction structure and the array pitch in the vertical MOSFET to be determined without being restricted by each other. To achieve this, for example, Patent Document 1 proposes to determine the interval of trench MOSFETs, irrespective of the pillar pitch in the superjunction structure, by rotating the longitudinal direction of the trench MOSFETs 45 degrees from the longitudinal direction of the pillars. In that case, Patent Document 1 has claimed that excellent characteristics can be obtained by, in particular in Si crystals, using (110) planes as the side walls of trenches for forming pillars and accordingly using (100) planes as the side walls of trenches for forming control electrodes.

PRIOR ART DOCUMENT

Patent Document

Patent Document 1: Japanese Patent Application Laid-Open No. 2010-040975

SUMMARY

Problem to be Solved by the Invention

According to the above-described technique described in the above Japanese Patent Application Laid-Open No. 2010-040975, for example in the case of an n-channel type MOSFET, portions that intersect with the p-type pillars in a longitudinally extending MOSFET structure cannot contribute to switching operations. This poses a limitation on an improvement in the density along the effective channel width and correspondingly poses a limitation on the effect of reducing the on-resistance as a result of reducing the channel resistance.

The present invention has been made in order to solve problems as described above, and it is an object of the present invention to provide a semiconductor device capable of reducing the on-resistance as a result of reducing the channel resistance.

Means to Solve the Problem

A semiconductor device according to the present invention includes a switchable current path. The semiconductor device includes a semiconductor layer, a first main electrode, a superjunction layer, a plurality of first wells, a plurality of first impurity regions, a plurality of second wells, a plurality of second impurity regions, a control electrode, and a second main electrode. The semiconductor layer has a first surface and a second surface opposite to the first surface. The first main electrode is provided on the first surface. The superjunction layer is provided on the second surface of the semiconductor layer and includes a plurality of first pillars of a first conductivity type and a plurality of second pillars of a second conductivity type different from the first conductivity type in a section of the active region that is perpendicular to the second surface of the semiconductor layer, the plurality of first pillars and the plurality of second pillars being alternately aligned in an in-plane direction of the second surface. The plurality of first wells of the second conductivity type are provided respectively on the plurality of second pillars and reach the first pillars on the superjunction layer. The plurality of first impurity regions of the first conductivity type are provided respectively on the plurality of first wells and separated from the first pillars by the first wells. The plurality of second wells of the second conductivity type are provided respectively on the plurality of first pillars and disposed spaced from the second pillars in the section. The plurality of second impurity regions of the first conductivity type are provided respectively on the plurality of second wells and separated from the first pillars by the second wells. The control electrode opposes the first wells between the first pillars and the first impurity regions via an insulation film, and opposes the second wells between the first pillars and the second impurity regions via the insulation film. The second main electrode is joined to each of the first wells, the second wells, the first impurity regions, and the second impurity regions.

Effects of the Invention

According to the present invention, not only the first wells in the second pillars but also the second wells in the first pillars can contribute to the switching of the current path. This increases the density along the channel width. Accordingly, the on-resistance of the semiconductor device can be reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 36 is a sectional perspective view schematically illustrating a third step in the method of manufacturing the semiconductor device according to Embodiment 7 of the present invention.

DESCRIPTION OF EMBODIMENTS

Figure 1:
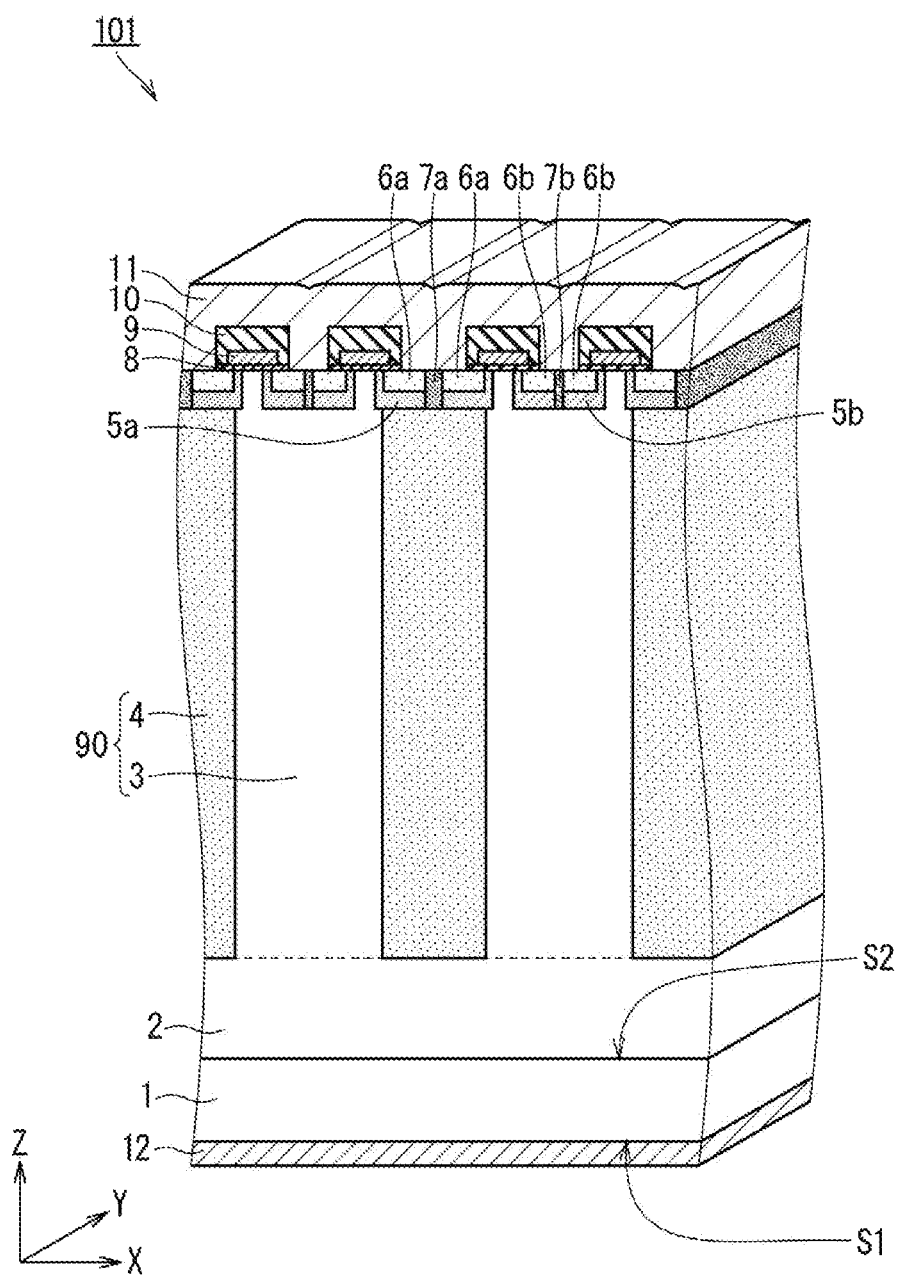
FIG. 1 is a sectional perspective view schematically illustrating a configuration of a semiconductor device according to Embodiment 1 of the present invention.

Embodiments of the present invention will be described hereinafter with reference to the drawings. Note that identical or corresponding parts in the following drawings are given the same reference signs, and descriptions thereof are not repeated. In the drawings, dot patterns are given for reference to facilitate viewing of the drawings.

Embodiment 1

Configuration

Figure 2:
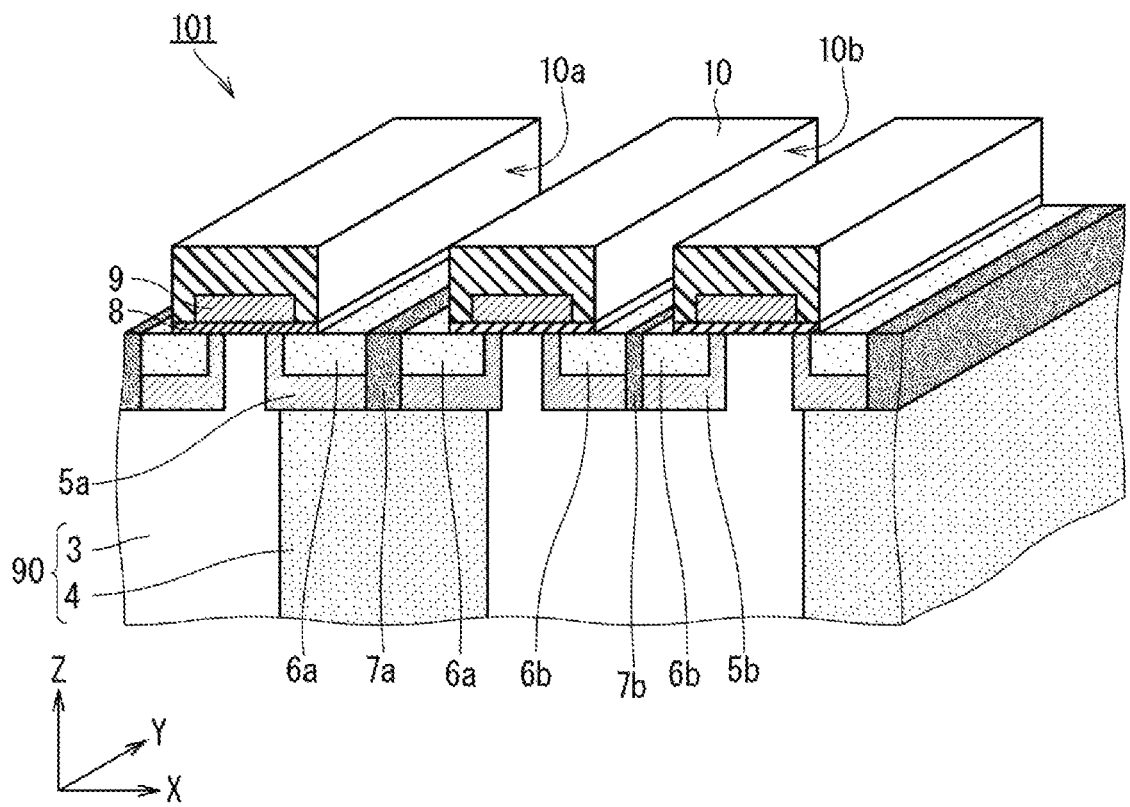
FIG. 2 is a partial enlarged view in which a second main electrode in FIG. 1 is not shown.
Figure 3:
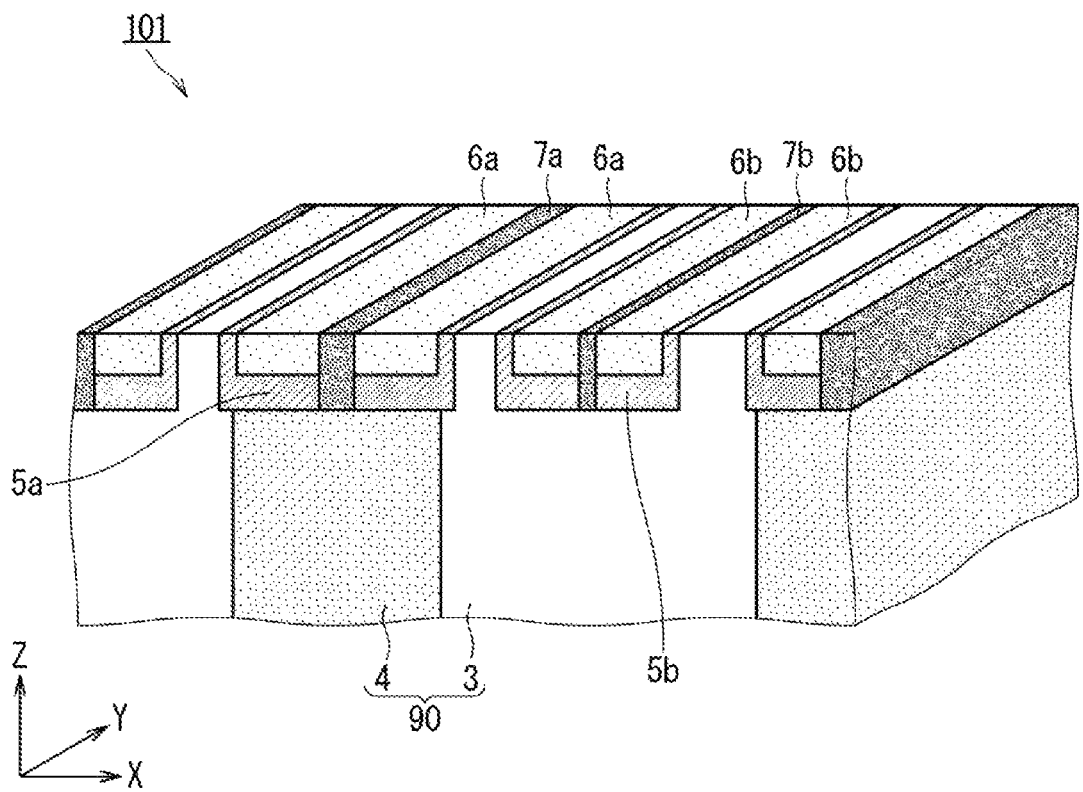
FIG. 3 is a diagram in which a structure in the vicinity of a control electrode in FIG. 2 is not shown.
Figure 4:
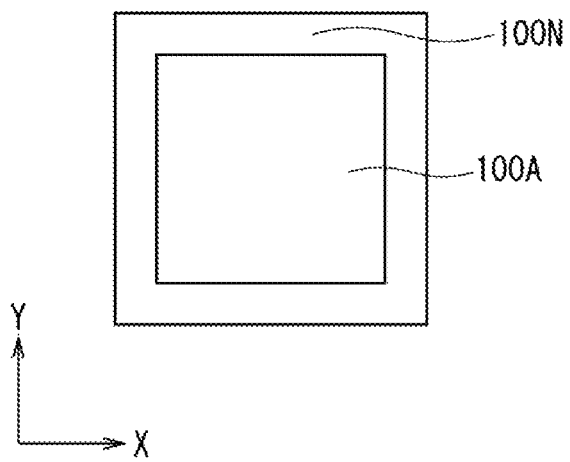
FIG. 4 is a plan view schematically illustrating a plan layout of the semiconductor device according to Embodiment 1 of the present invention.

FIG. 1 is a sectional perspective view schematically illustrating a configuration of an MOSFET 101 (semiconductor device) according to Embodiment 1 of the present invention. FIG. 2 is a partial enlarged view in which a source electrode 11 (second main electrode) in FIG. 1 is not shown. FIG. 3 is a diagram in which a structure in the vicinity of a gate electrode 9 (control electrode) in FIG. 2 is not shown. FIG. 4 is a plan view schematically illustrating a plan layout of the MOSFET 101.

The MOSFET 101 is a device including an active region 100A (FIG. 4) that includes switchable current paths. The MOSFET 101 is of a planar gate type. In the plan layout (FIG. 4), the MOSFET 101 includes the above active region 100A including the current path and a non-active region 100N arranged outside the active region. Typically, the active region 100A has a fine periodic structure for configuring the switchable current paths, and the non-active region 100N has a structure for suppressing the withstand voltage. FIGS. 1 to 3 illustrate a structure in the active region 100A.

The MOSFET 101 includes a semiconductor substrate 1 (semiconductor layer), a drain electrode 12 (first main electrode), a superjunction layer 90, a plurality of first wells 5a, a plurality of first source regions 6a (first impurity regions), a plurality of second wells 5b, a plurality of second source regions 6b (second impurity regions), the gate electrode 9 (control electrode), and the source electrode 11 (second main electrode). The MOSFET 101 includes a gate insulation film 8 (insulation film), the gate electrode 9, and an interlayer insulation film 10 in order to configure an MOS structure (MOSFET cells). In the present embodiment, the MOSFET 101 includes an epitaxial layer 2. The MOSFET 101 according to the present embodiment also includes contact regions 7a and contact regions 7b.

The semiconductor substrate 1 has a lower surface S1 (first surface) and an upper surface S2 (second surface) opposite to the lower surface S1. The XYZ coordinate system illustrated in the drawings is arranged such that XY planes are parallel to the upper surface S2, and the Z axis is parallel to the direction along the thickness of the semiconductor substrate 1. The current paths in the MOSFET 101 are formed to connect the lower surface S1 and the upper surface S2. Thus, the MOSFET 101 is a so-called vertical switching device. The semiconductor substrate 1 is of an n-type (first conductivity type).

The epitaxial layer 2 is formed by epitaxial crystal growth on the upper surface S2 of the semiconductor substrate 1. The epitaxial layer 2 is of the n-type. Typically, the impurity concentration in the epitaxial layer 2 is lower than the impurity concentration in the semiconductor substrate 1.

The superjunction layer 90 is provided on the upper surface S2 of the semiconductor substrate 1 via the epitaxial layer 2. In a section (FIG. 1) of the active region 100A that is perpendicular to the upper surface S2 of the semiconductor substrate 1, the superjunction layer 90 includes a plurality of n-type pillars 3 (first pillars) of the n-type (first conductivity type) and a plurality of p-type pillars 4 (second pillars) of a p-type (second conductivity type different from the first conductivity type) that are alternately aligned in in-plane directions of the upper surface S2 (XY in-plane directions in FIG. 1). Specifically, in the present embodiment, the n-type pillars 3 and the p-type pillars 4 are alternately aligned in one direction (X direction in FIG. 1) out of the in-plane directions (XY in-plane directions in FIG. 1), and each extend in the direction (Y direction) orthogonal to the one direction (X direction) out of the in-plane directions (XY in-plane directions in FIG. 1). That is, in a layout that is parallel to the upper surface S2 of the semiconductor substrate 1 (also referred to as a plan layout), the n-type pillars 3 and the p-type pillars 4 are arranged in stripes. Preferably, in the section of the active region 100A that is perpendicular to the upper surface S2 of the semiconductor substrate 1 (section parallel to the ZX plane in FIG. 1), the p-type pillars 4 have the same width (dimension in the X direction in FIG. 1) and are arranged at regular intervals (intervals in the X direction in FIG. 1).

The superjunction layer 90 according to the present embodiment is made of SiC. That is, the MOSFET 101 is preferably a silicon carbide semiconductor device. In order to facilitate formation of the superjunction layer 90 made of SiC, it is also preferable for the epitaxial layer 2 and the semiconductor substrate 1 to be made of SiC. The epitaxial layer 2 may be omitted, and in this case, the superjunction layer 90 is provided not indirectly but directly on the upper surface S2 of the semiconductor substrate 1.

The first wells 5a are of the p-type. The first wells 5a are respectively provided on the p-type pillars 4. The first wells 5a reach the n-type pillars 3 on the superjunction layer 90 and preferably extend to above the n-type pillars 3 as illustrated in FIGS. 1 to 3. The first source regions 6a are of the n-type. The first source regions 6a are respectively provided on the first wells 5a and separated from the n-type pillars 3 by the first wells 5a.

The second wells 5b are of the p-type. The second wells 5b are respectively provided on the n-type pillars 3. The second wells 5b are disposed spaced from the p-type pillars 4 in the section (FIG. 1) of the active region 100A that is perpendicular to the upper surface S2 of the semiconductor substrate 1. The second source regions 6b are of the n-type.

The second source regions 6b are respectively provided on the second wells 5b and separated from the n-type pillars 3 by the second wells 5b. In the present embodiment, the second wells 5b are arranged in stripes in the layout parallel to the upper surface S2 of the semiconductor substrate 1. Preferably, each of the second wells 5b has a smaller width than each of the first wells 5a in the section (FIG. 1) of the active region 100A that is perpendicular to the upper surface S2 of the semiconductor substrate 1. Note that the first wells 5a may have the same width, and the second wells 5b may have the same width.

The source electrode 11 is provided on the upper surface S2 side of the semiconductor substrate 1 and joined to each of the first wells 5a, the second wells 5b, the first source regions 6a, and the second source regions 6b. In the present embodiment, parts of the first wells 5a form the contact regions 7a having a relatively high concentration, and the source electrode 11 is joined to the contact regions 7a, which are parts of the first wells 5a. Similarly, parts of the second wells 5b form the contact regions 7b having a relatively high concentration, and the source electrode 11 is joined to the contact regions 7b, which are parts of the second wells 5b. The drain electrode 12 is provided on the lower surface S1 of the semiconductor substrate 1.

The gate electrode 9 opposes the first wells 5a between the n-type pillars 3 and the first source regions 6a via the gate insulation film 8, and also opposes the second wells 5b between the n-type pillars 3 and the second source regions 6b via the gate insulation film 8. In the present embodiment, the gate electrode 9 has a stripe plan layout as illustrated in FIG. 2. The interlayer insulation film 10 isolates the gate electrode 9 from the source electrode 11.

The gate insulation film 8 is typically an oxide film, but may be any other insulation film. Thus, the semiconductor device is not limited to an MOSFET, and may be a metal insulator semiconductor field effector transistor (MISFET) other than the MOSFET. The same can be said of the other embodiments.

Operations

When a gate voltage that exceeds a threshold value is applied to the gate electrode 9, the MOSFET 101 is turned on. Specifically, channels are formed in the first wells 5a between the n-type pillars 3 and the first source regions 6a, and channels are formed in the second wells 5b between the n-type pillars 3 and the second source regions 6b. Accordingly, the source electrode 11 and the drain electrode 12 are electrically connected by electrical paths that pass through the first source regions 6a, the first wells 5a, the n-type pillars 3, the epitaxial layer 2, and the semiconductor substrate 1 and by electrical paths that pass through the second source regions 6b, the second wells 5b, the n-type pillars 3, the epitaxial layer 2, and the semiconductor substrate 1.

When the value of the gate voltage does not exceed the above threshold value, the MOSFET 101 is turned off. At this time, each pillar becomes depleted by emission of majority carriers from the pillar. In particular, holes emitted from the p-type pillars 4 move to the source electrode 11 through the contact regions 7a.

Comparative Example

Figure 5:
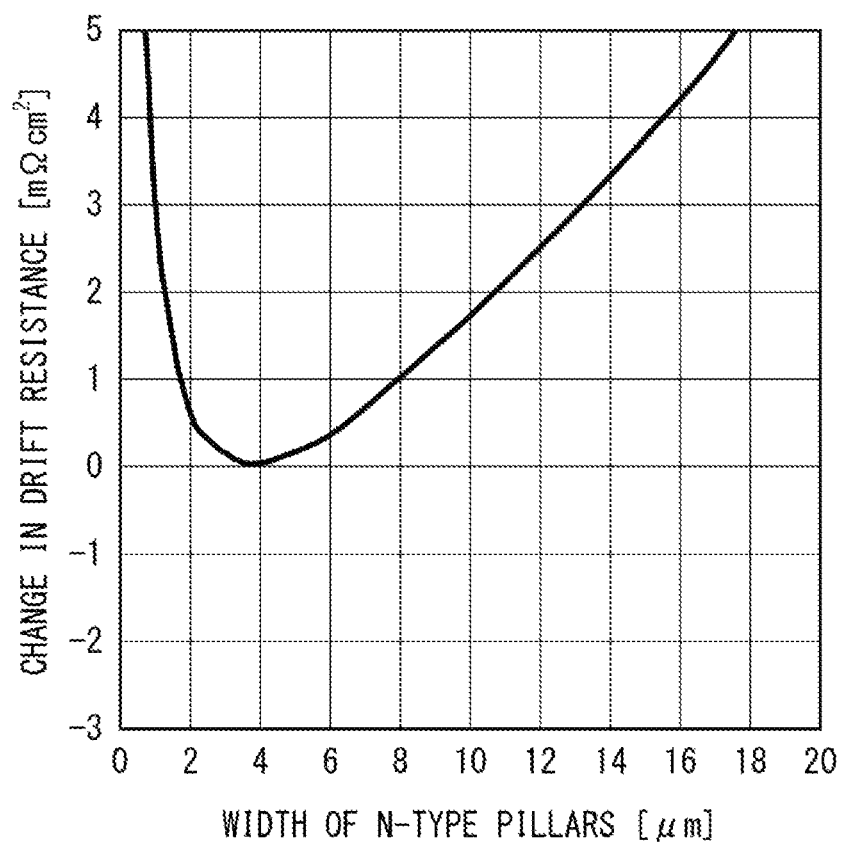
FIG. 5 is a graph showing an example of the result of calculating the relationship between the width of n-type pillars and a change in drift resistance.

FIG. 5 is a graph illustrating the result of calculating the relationship between the width of the n-type pillars 3 (dimension in the X direction in FIG. 1) and a change in drift resistance. As calculation conditions, the width of the p-type pillars 4 are fixed to 8 μm, and the drift resistance is calculated using the width of the n-type pillars 3 as a parameter. Using a minimum value of the drift resistance obtained from the calculation result as a reference, the vertical axis in FIG. 5 indicates the amount of change from the minimum value. In the calculation, the donor concentration in the n-type pillars 3 and the acceptor concentration in the p-type pillars 4 are set such that both of the n-type pillars and the p-type pillars become completely depleted. In the calculation, consideration is also given to the presence of the epitaxial layer 2 with a given thickness as a buffer layer for the superjunction layer 90. Here, only the n-type pillars 3 can function as current paths in the superjunction layer 90, which serves as a drift layer. If the donor concentration in the n-type pillars 3 is set high, the conductivity of the current paths will increase, but in order to achieve the above complete depletion, it is necessary to reduce the width of the n-type pillars 3 serving as the current paths. On the contrary, if the donor concentration in the n-type pillars 3 is set low, the conductivity of the current paths will decrease, but it becomes possible to further increase the width of the n-type pillars 3 serving as the current paths.

In order to minimize the drift resistance while enabling complete depletion, when the p-type pillars 4 have a width of 8 μm, the n-type pillars 3 are set to have a width of 4 μm and accordingly the pillar pitch becomes 12 μm, which is a total width of an n-type pillar 3 and a p-type pillar 4, according to the present calculation example. In an MOSFET (not shown) according to the comparative example, MOS structures are arranged with the same pitch as this pillar pitch. The value of this pillar pitch, i.e., 12 μm, is approximately two times greater than the pitch of MOS structures in an ordinary MOSFET that does not have a superjunction structure. Therefore, in the comparative example, the MOS structures become sparse due to the adoption of the superjunction structure, and consequently the density along the channel width will decrease sharply. Accordingly, in the case where the channel resistance has a great influence on the on-resistance, it is difficult in the comparative example to obtain a sufficiently small on-resistance.

In particular, when SiC is used as a semiconductor material, the carrier mobility in channels is extremely lower than the value expected from the carrier mobility in crystals due to a high interface state density at the $SiC/SiO_2$ interface. For this reason, SiC-MOSFETs have originally high channel resistances. If the density along the channel width decreases as described above, the channel resistance will further increase. Consequently, even in the case of a high breakdown-voltage MOSFET with a relatively high drift resistance, the channel resistance becomes a primary component of the on-resistance. Accordingly, it is difficult in the comparative example to obtain a sufficiently low on-resistance.

In contrast, according to the present embodiment, the n-type pillars 3 and the p-type pillars 4 each have an MOS structure as illustrated in FIG. 1. That is, MOS structures are provided with a pitch that is one-half the pillar pitch. Therefore, MOS structures can be provided at a relatively high density even with the adoption of the superjunction structure. This consequently avoids sharply reducing the density along the channel width. Accordingly, a lower on-resistance than in the comparative example can be obtained when the channel resistance has a great influence on the on-resistance.

In the present embodiment, in order to provide an MOS structure in each of the n-type pillars 3 and the p-type pillars 4, the width of the n-type pillars 3 may be set larger than an optimum width considered from the viewpoint of reducing the drift resistance. For example, each n-type pillar 3 may have a greater width than each p-type pillar 4 as illustrated in FIG. 1. If the width of the n-type pillars 3 is increased, the drift resistance will increase because the donor concentration for enabling complete depletion will decrease. However, if the decrease in the channel resistance is greater than the increase in the drift resistance, the on-resistance of the MOSFET as a whole will decrease.

Manufacturing Method

FIGS. 6 to 10 are sectional perspective views schematically illustrating first to fifth steps in the method of manufacturing the MOSFET 101 (FIG. 1).

Figure 6:
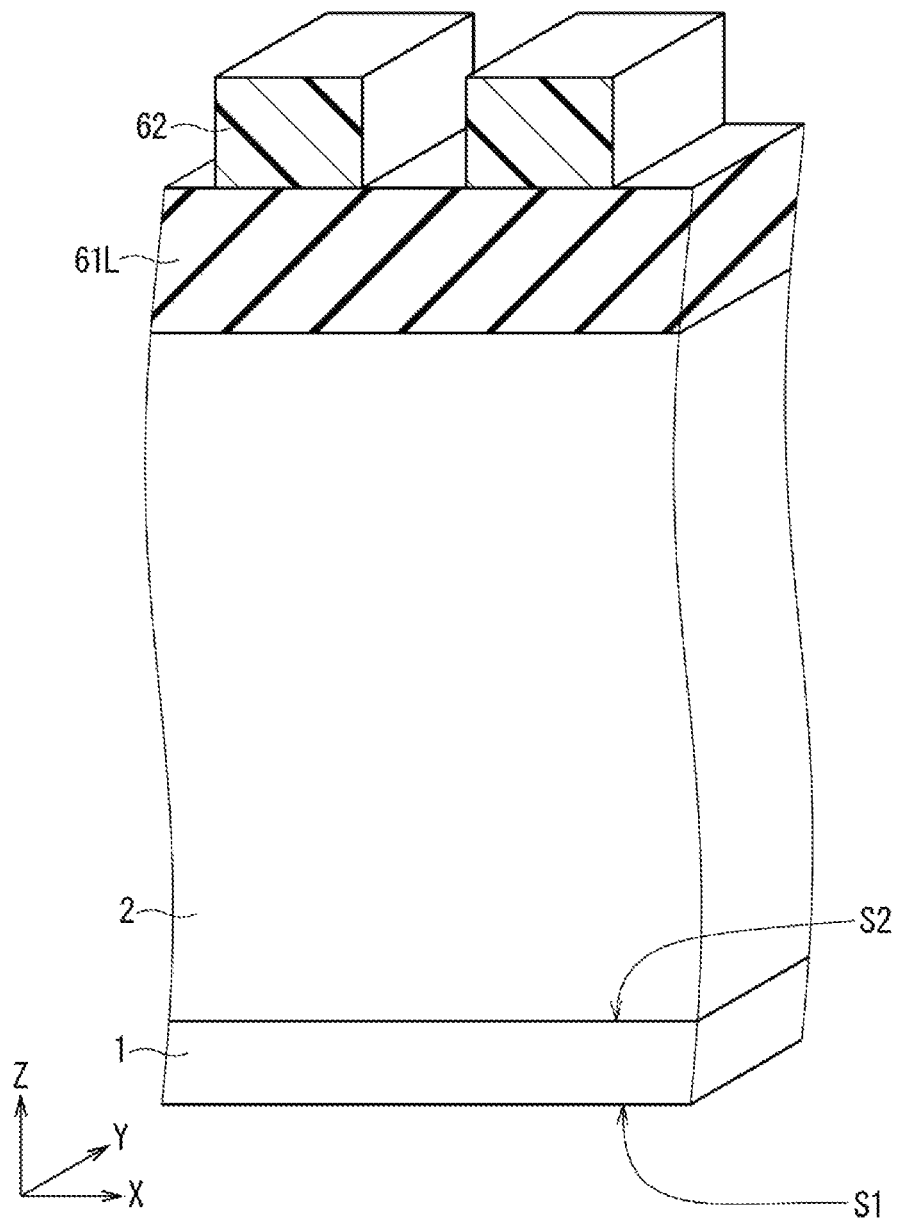
FIG. 6 is a sectional perspective view schematically illustrating a first step in a method of manufacturing the semiconductor device according to Embodiment 1 of the present invention.

Referring to FIG. 6, the n-type semiconductor substrate 1 made of SiC is prepared. The surface orientation of the upper surface S2 of the semiconductor substrate 1 is not particularly limited, and it may, for example, be a surface orientation in the c-axial direction. In that case, the substrate may have an off angle of approximately 8 degrees or less from the c-axis.

The n-type epitaxial layer 2 is formed by epitaxial growth on the upper surface S2. The dopant concentration in the epitaxial layer 2 is, for example, in the range of $1 \times 10^{13}$ to $1 \times 10^{18}$ $cm^{-3}$. The thickness of the epitaxial layer 2 is set to be greater than the thickness of the superjunction layer 90 (FIG. 1), and in the case where the superjunction layer 90 is formed to a thickness greater than or equal to 40 μm as described above, the thickness of the epitaxial layer 2 is, for example, in the range of 40 μm to 200 μm. For example, if the superjunction layer 90 has a thickness of 30 μm, the epitaxial layer 2 may have a thickness greater than or equal to 30 μm.

On the epitaxial layer 2, an oxide film 61L is deposited. Then, a resist mask 62 is formed on the oxide film 61L. Etching using the resist mask 62 is performed, and thereafter the resist mask 62 is removed.

Figure 7:
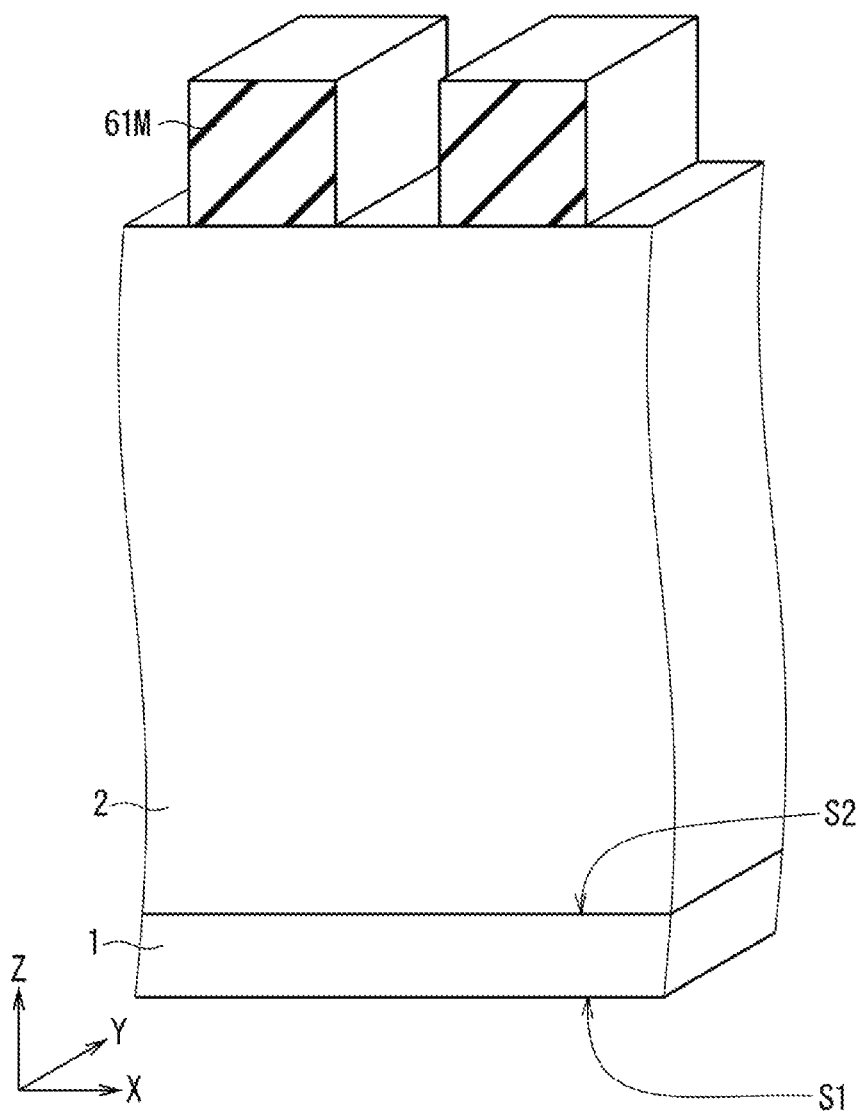
FIG. 7 is a sectional perspective view schematically illustrating a second step in the method of manufacturing the semiconductor device according to Embodiment 1 of the present invention.

Referring to FIG. 7, an oxide-film mask 61M is formed on the epitaxial layer 2 by the above etching. Etching using the oxide-film mask 61M is performed, and thereafter the oxide-film mask 61M is removed.

Figure 8:
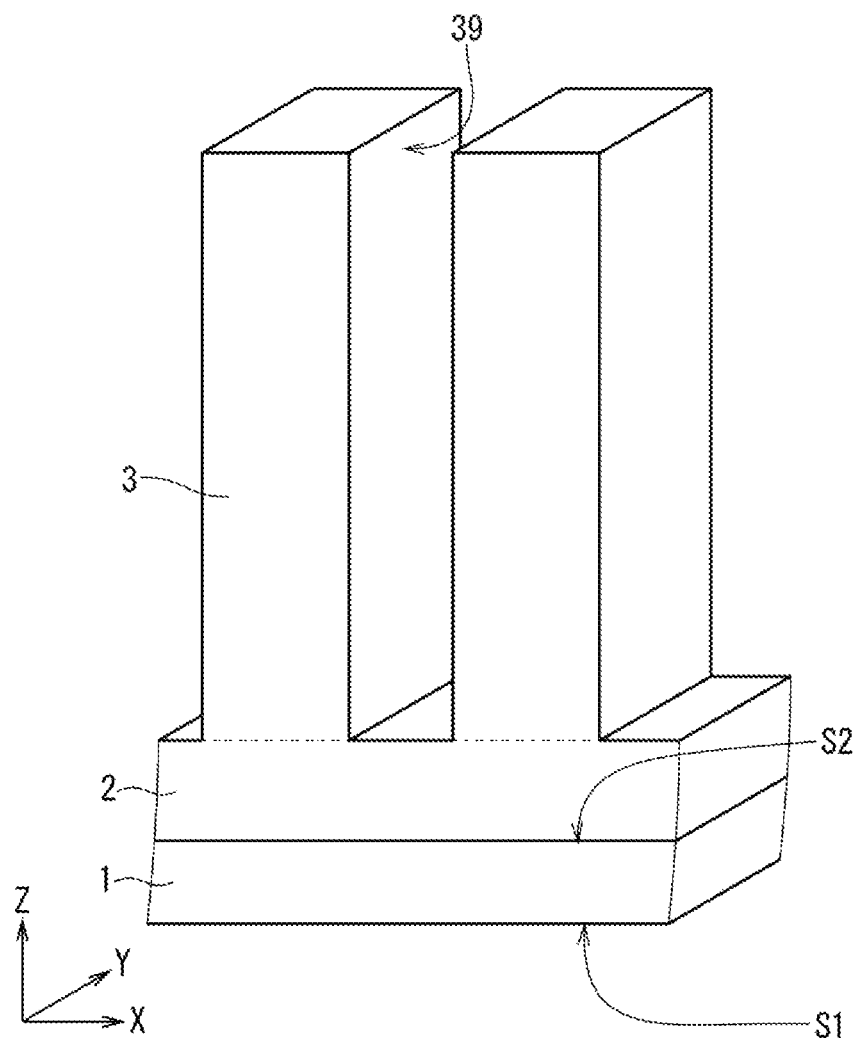
FIG. 8 is a sectional perspective view schematically illustrating a third step in the method of manufacturing the semiconductor device according to Embodiment 1 of the present invention.

Referring to FIG. 8, the n-type pillars 3 are formed from the upper portion of the epitaxial layer 2 by the above etching, and trenches 39 in which the p-type pillars 4 (FIG. 1) are to be embedded are formed. The aspect ratio of the width and depth of the p-type pillars 4 used in the superjunction structure is based on the aspect ratio of these trenches 39. In order to facilitate control of the shape with a high aspect ratio, it is preferable to use dry etching such as reactive ion etching or sputter etching. If there is no need for such control, wet etching may be used.

Figure 9:
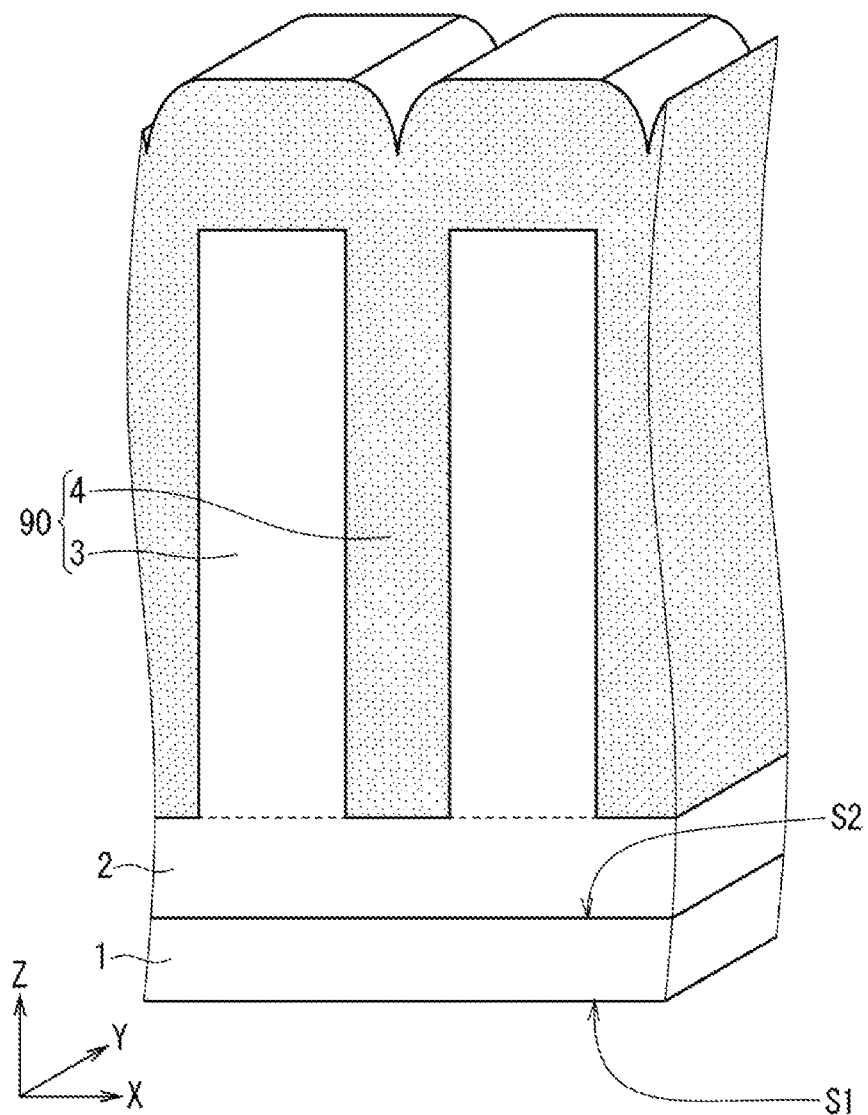
FIG. 9 is a sectional perspective view schematically illustrating a fourth step in the method of manufacturing the semiconductor device according to Embodiment 1 of the present invention.

Referring to FIG. 9, the p-type pillars 4 are formed by embedding a p-type semiconductor crystal in the trenches 39. This step is implemented by forming a p-type epitaxial layer inside the trenches 39 and on the n-type pillars 3 by p-type epitaxial growth. In the surface of the p-type epitaxial layer, level differences are formed so as to reflect the shapes of the trenches 39. It is desirable that the trenches 39 are completely filled as a result of the epitaxial growth, but completely filling the trenches 39 is not an absolute necessity. This epitaxial growth is performed such that the p-type pillars 4 have a desired acceptor concentration NA. The amount of acceptor impurities contained in the p-type pillars 4 are made equal to the amount of donor impurities contained in the n-type pillars 3 because of the necessity to maintain charge balancing in the pillars. In the case where an n-type buffer layer (portion under the broken line in FIG. 8) is present under the p-type pillars 4, the amount of donor impurities contained in this buffer layer is also taken into consideration for the sake of charge balancing. The acceptor concentration NA in the p-type pillars 4 and the donor concentration ND in the n-type pillars 3 are in the range of $1\times10^{13}$ to $1\times10^{18}$ cm$^{-3}$. The n-type pillars 3 and the p-type pillars 4 may have the same width, or may have different widths. The donor concentration ND in the n-type pillars 3 and the acceptor concentration NA in the p-type pillars 4 may be the same, or may be different.

Figure 10:
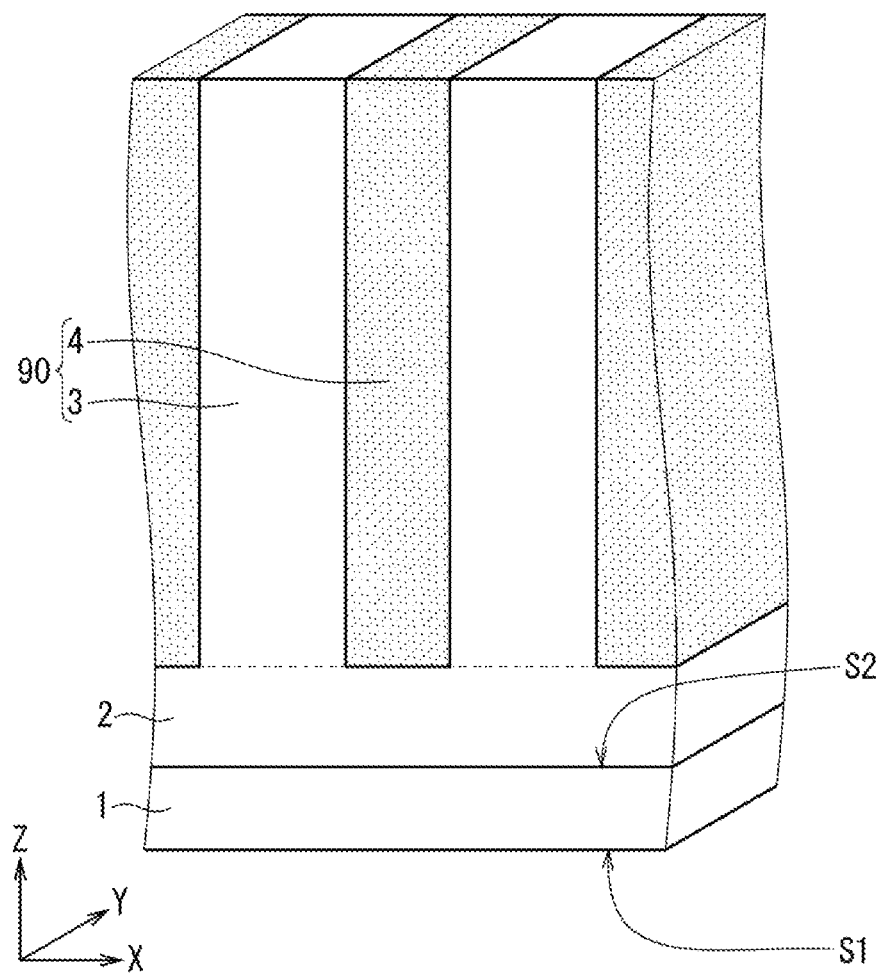
FIG. 10 is a sectional perspective view schematically illustrating a fifth step in the method of manufacturing the semiconductor device according to Embodiment 1 of the present invention.

Referring to FIG. 10, the aforementioned p-type epitaxial layer is partially removed by chemical mechanical polishing (CMP) until the upper portions of the n-type pillars 3 are exposed, and the surface of the wafer including the p-type epitaxial layer is flattened. In order to improve uniformity of the thicknesses of the n-type pillars 3 and the p-type pillars 4, the rear surface of the wafer, i.e., the lower surface S1 of the semiconductor substrate 1, may be polished before the CMP.

Referring back to FIG. 3, the first wells 5a, the second wells 5b, the first source regions 6a, the second source regions 6b, the contact regions 7a, and the contact regions 7b are formed. They may be formed by, for example, ion implantation of dopants using a resist mask (not shown) processed by a photoengraving process. As described previously, the first wells 5a, the second wells 5b, the contact regions 7a, and the contact regions 7b are of the p-type, whereas the first source regions 6a and the second source regions 6b are of the n-type. The dopant concentrations in the first wells 5a and the second wells 5b are desirably in the range of $1\times10^{15}$ to $1\times10^{19}$ cm$^{-3}$, and the depths thereof are set in the range of, for example, 0.3 μm to 4.0 μm. It is desirable that the dopant concentrations in the first source regions 6a and the second source regions 6b exceed the dopant concentrations in the first wells 5a and the second wells 5b, and for example, they are in the range of $1\times10^{18}$ to $1\times10^{21}$ cm$^{-3}$. The depths of the first source regions 6a and the second source regions 6b are set so as not to exceed the depths of the first wells 5a and the second wells 5b. The contact regions 7a and 7b may be formed by ion implantation using the same mask, and the dopant concentrations in the contact regions 7a and 7b are desirably in the range of $1\times10^{18}$ to $1\times10^{21}$ cm$^{-3}$. The ion implantation is desirably implemented at a substrate temperature greater than or equal to 200° C. The contact regions 7a and 7b are respectively provided for further improving the electrical contact between the first wells 5a and the second wells 5b, so that operations as an MOSFET element are possible even without the contact regions 7a and 7b.

Next, heat treatment is performed at a temperature of, for example, 1500° C. to 2200° C. for 0.5 to 60 minutes in vacuum or in an inert gas such as argon or nitrogen. This electrically activates implanted impurities. Then, a surface-affected layer is removed as a result of forming an oxide film through sacrificial oxidation and removing the oxide film using hydrofluoric acid. Accordingly, a clean surface is obtained. Then, a field insulation film (not shown) having an opening in the active region 100A (FIG. 4) is formed. The formation of the field insulation film is implemented by depositing and patterning a silicon oxide film.

Referring back to FIG. 2, the gate insulation film 8 is formed on the wafer surface. The gate insulation film 8 is formed by, for example, thermal oxidation or deposition. Next, the gate electrode 9 is formed so as to cover the first wells 5a between the n-type pillars 3 and the first source regions 6a and cover the second wells 5b between the n-type pillars 3 and the second source regions 6b when the wafer is viewed from above. As the material for the gate electrode 9, polysilicon containing high-concentration dopants is generally used. After the polysilicon is deposited on the entire wafer surface by chemical vapor deposition, unnecessary portions are removed by dry etching.

Next, the interlayer insulation film 10 is deposited by, for example, chemical vapor deposition. Then, the interlayer insulation film 10 and the gate insulation film 8 are partially removed using a resist mask formed by a photoengraving process and by etching such as dry etching using the resist mask, so as to expose the first source regions 6a, the second source regions 6b, the contact regions 7a, and the contact regions 7b. That is, contact holes 10a and contact holes 10b are formed.

The source electrode 11 (FIG. 1) is formed in contact with the first source regions 6a and the contact region 7a through the contact holes 10a and in contact with the second source regions 6b and the contact regions 7b through the contact holes 10b. Also, gate wiring (not shown) is formed that is electrically connected to the gate electrode 9 in the non-active region 100N (FIG. 4). The drain electrode 12 is formed on the lower surface S1 of the semiconductor substrate 1. The source electrode 11 and the drain electrode 12 are formed by, for example, depositing a metal such as Al, Ti, Cu, or Au or an alloy of these metals by sputtering or vapor deposition. Alternatively, silicide layers may be formed in advance on surfaces of the wafer that come into contact with the source electrode 11 and the drain electrode 12, by causing reactions of SiC and Ni, for example. In the case of forming the silicide layers, the contact resistance is expected to decrease.

Through the steps described above, the MOSFET 101 (FIG. 1) is completed.

Effects

According to the present embodiment, as described in comparison with the above-described comparative example, not only the first wells 5a in the p-type pillars 4 but also the second wells 5b in the n-type pillars 3 can contribute to the switching of the current paths in the active region 100A (FIG. 4). This increases the density along the channel width. Accordingly, the on-resistance of the MOSFET 101 can be reduced.

In the present embodiment, the first conductivity type is an n-type, and the second conductivity type is a p-type. In this case, the p-type pillars 4 are connected to the source electrode 11 via the first wells 5a including the contact regions 7a. This suppresses the contact resistance between the p-type pillars 4 and the source electrode. Therefore, holes are likely to be emitted from the p-type pillars 4 to the source electrode 11 at turn-off. Accordingly, the superjunction layer 90 becomes sufficiently depleted at turn-off, and it is possible to obtain a sufficient effect of improving the withstand voltage with the superjunction structure. In general, the mobility of holes is lower than the mobility of electrons, and thus it is particularly important to accelerate the emission of holes in the case of adopting a superjunction structure. This effect is particularly large when a wide bandgap semiconductor such as SiC or a semiconductor with low hole mobility in p-type regions is used as the material for the superjunction layer 90. This is because, since SiC has a wide bandgap of approximately 3.26 eV, holes in the p-type pillars 4 made of SiC are unlikely to disappear naturally, and thus it is highly required to discharge holes from the source electrode 11.

Contrary to the above description, the first conductivity type may be a p-type, and the second conductivity type may be an n-type. In this case, n-type pillars are connected to the source electrode via n-type first wells including n-type contact regions. This achieves the effect of facilitating the emission of electrons from the pillars to the source electrode at turn-off. The material for the superjunction layer 90 is not limited to SiC, and may, for example, be silicon (Si).

In the layout parallel to the upper surface S2 of the semiconductor substrate 1, the n-type pillars 3 and the p-type pillars 4 are arranged in stripes. Such a strip pattern can be formed relatively easily as compared to more complex patterns.

In the layout parallel to the upper surface S2 of the semiconductor substrate 1, the second wells 5b are arranged in stripes. Such a strip pattern can be formed relatively easily as compared to more complex patterns.

The first wells 5a extend to above the n-type pillars 3. Thus, the first wells 5a can reach the n-type pillars 3 with more certainty even if there are variations in steps. Accordingly, channels configured by the first wells 5a can be formed with more certainty.

In the section (FIG. 1) of the active region 100A (FIG. 4) that is perpendicular to the upper surface S2 of the semiconductor substrate 1, the p-type pillars 4 have the same width and are arranged at regular intervals. Accordingly, it is possible to easily optimize charge balancing in the superjunction structure in the active region 100A.

In the section (FIG. 1) of the active region 100A (FIG. 4) that is perpendicular to the upper surface S2 of the semiconductor substrate 1, the second wells 5b have a smaller width than the first wells 5a. The width of the second wells 5b can be reduced within a tolerable range of limitations on the manufacturing process, irrespective of the structure of the superjunction layer 90. Therefore, the width of the second wells 5b does not necessarily have to be the same as the width of the first wells 5a, and may be further reduced. Accordingly, the density along the channel width can be further increased as compared to that in the case where the first and second wells have the same width.

Embodiment 2

Configuration

Figure 11:
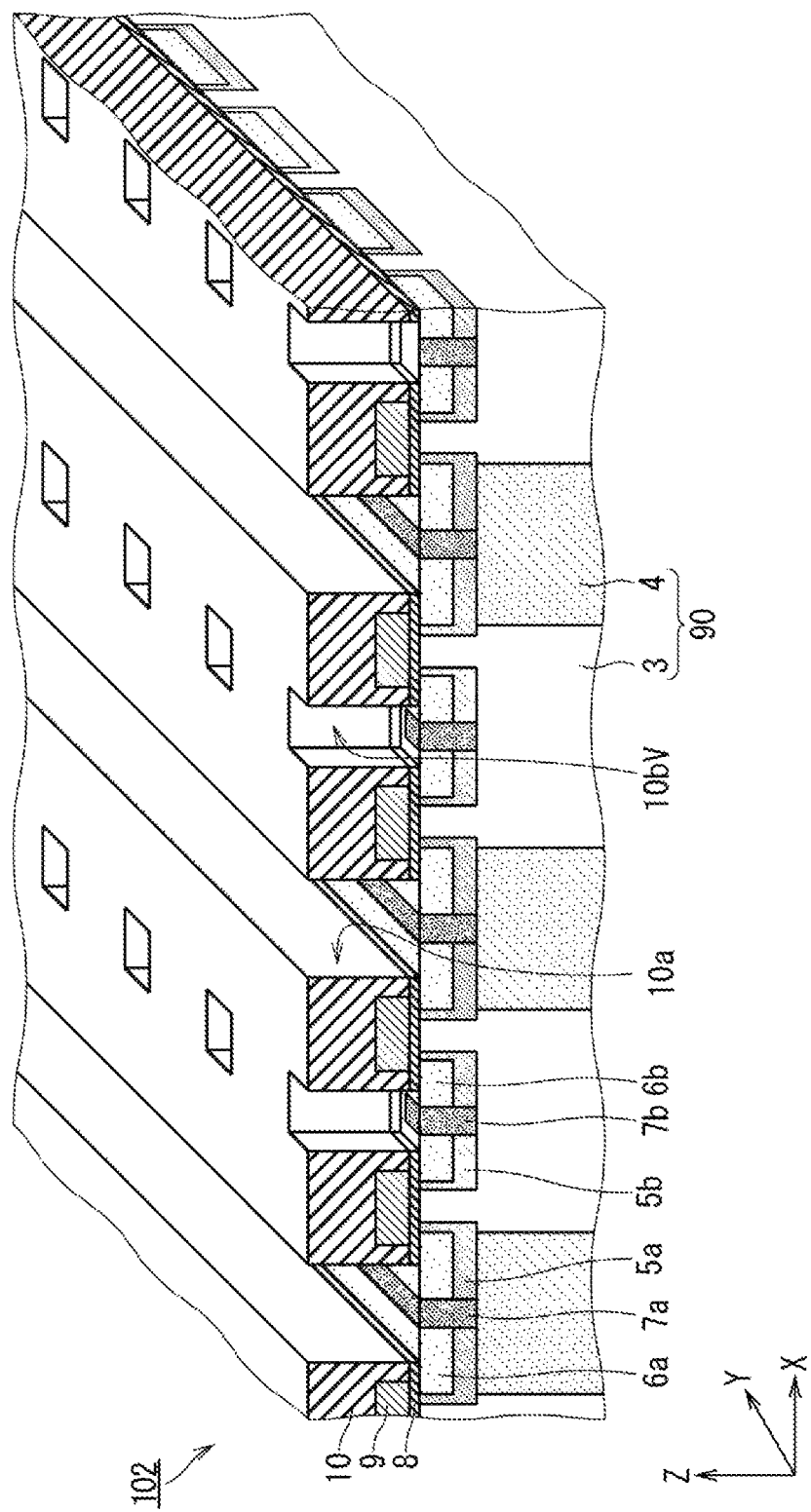
FIG. 11 is a sectional perspective view schematically illustrating a configuration of a semiconductor device according to Embodiment 2 of the present invention, in which a second main electrode is not shown.
Figure 12:
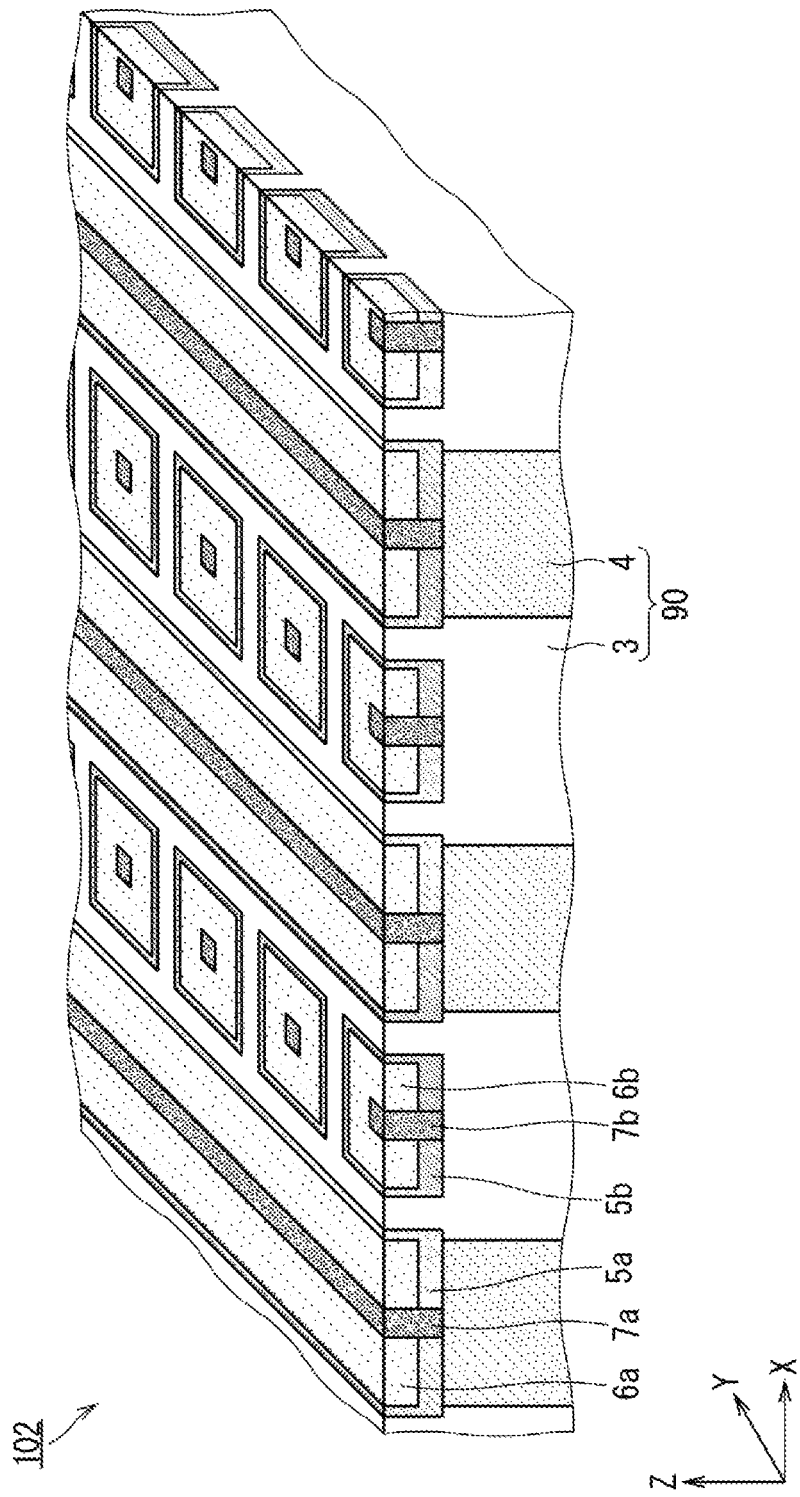
FIG. 12 is a diagram in which a structure in the vicinity of a control electrode in FIG. 11 is not shown.

FIG. 11 is a sectional perspective view schematically illustrating a configuration of an MOSFET 102 (semiconductor device) according to Embodiment 2 of the present invention, in which the source electrode 11 (see FIG. 1) is not shown. FIG. 12 is a diagram in which a structure in the vicinity of the gate electrode 9 in FIG. 11 is not shown.

As illustrated in FIG. 12, in the present embodiment, the second wells 5b have a plurality of well patterns as a layout that is parallel to the upper surface S2 of the semiconductor substrate 1, and the well patterns are arranged periodically along each of at least two directions. In FIG. 12, the well patterns are arranged periodically in each of the X and Y directions. In the X direction, adjacent well patterns are separated by the first wells 5a. Specifically, the first wells 5a have a stripe pattern as a plan layout as in Embodiment 1. The second wells 5b, on the other hand, have a discrete pattern along the n-type pillars 3 extending in the XY plane. The first source regions 6a and the contact regions 7a, which are formed inside the first wells 5a, are arranged in stripes. On the other hand, the second source regions 6b and the contact regions 7b are arranged in each of the above discrete second wells 5b while isolated from one another.

The configuration other than the above-described parts is substantially the same as the configuration described above in Embodiment 1. Thus, identical or corresponding constituent elements are given the same reference signs, and descriptions thereof are not repeated.

Manufacturing Method

First, the superjunction layer 90 is formed through similar steps to those in FIGS. 6 to 10 (Embodiment 1). Next, impurity regions are formed in the pattern illustrated in FIG. 12, instead of the pattern illustrated in FIG. 3 (Embodiment 1). This step may be implemented by a similar method to that of Embodiment 1, with the exception that the pattern is different.

Figure 13:
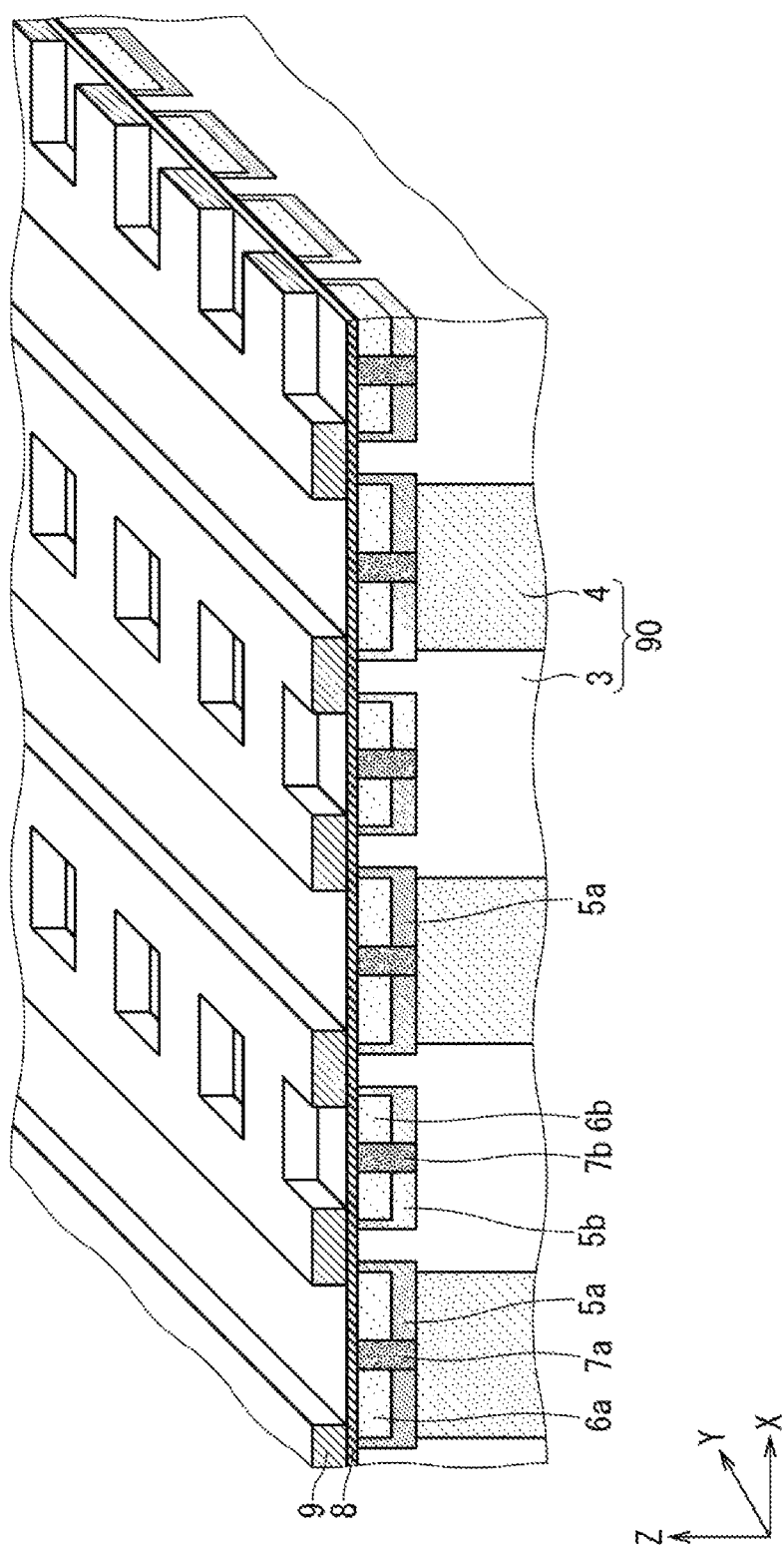
FIG. 13 is a sectional perspective view schematically illustrating a step in a method of manufacturing the semiconductor device according to Embodiment 2 of the present invention.

Referring to FIG. 13, the gate insulation film 8 and polysilicon serving as the material for the gate electrode 9 are subsequently deposited by a similar method to that of Embodiment 1. Then, this polysilicon is patterned by a similar method to that of Embodiment 1, except that the pattern is different, so that the gate electrode 9 is formed. Unlike in Embodiment 1 (FIG. 2), the gate electrode 9 according to the present embodiment has holes for ensuring paths that are used to connect the source electrode 11 (see FIG. 1) to the second source regions 6b and the contact regions 7b.

Referring back to FIG. 11, next, the interlayer insulation film 10 is deposited so as to cover the gate electrode 9. Then, the contact holes 10a and contact holes 10bV are formed in the interlayer insulation film 10, using a resist mask formed by a photoengraving process and by etching such as dry etching using that resist mask. Thereafter, through similar steps to those of Embodiment 1, the MOSFET 102 is completed.

Effects

According to the present embodiment, the second wells 5b (FIG. 12) have a plurality of well patterns as a plan layout, and the well patterns are arranged periodically along each of at least two directions (specifically, X and Y directions in the drawings). This further increases the density along the channel width as compared to that in the case where the second wells 5b are arranged in stripes as in Embodiment 1 (FIG. 3). Accordingly, the on-resistance of the MOSFET can be further reduced.

Embodiment 3

Configuration

Figure 14:
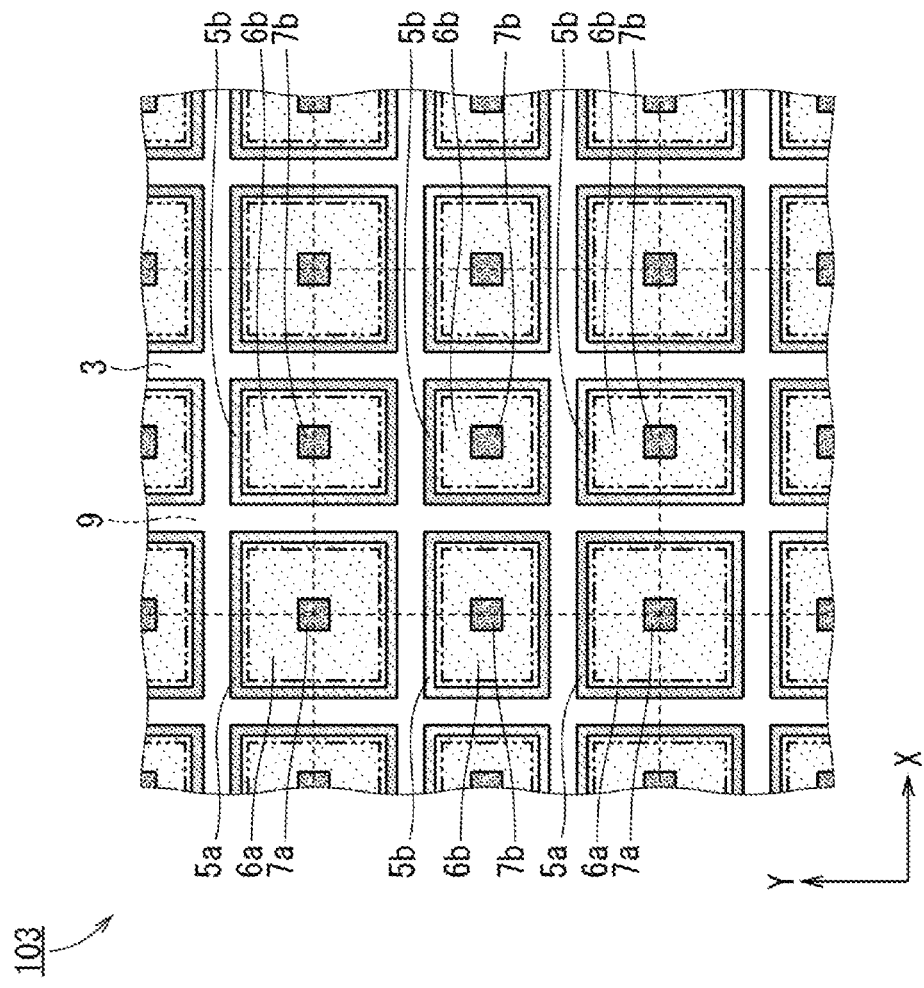
FIG. 14 is a partial plan view schematically illustrating a configuration of a semiconductor part of a semiconductor device according to Embodiment 3 of the present invention.
Figure 15:
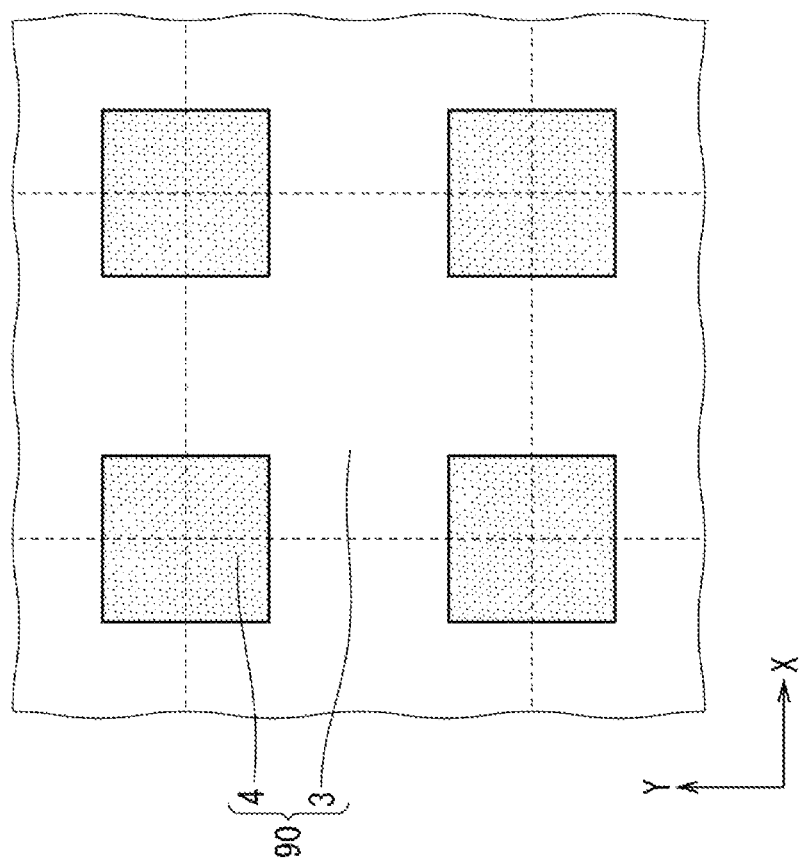
FIG. 15 is a partial plan view schematically illustrating a plan layout of a superjunction layer 90 of the semiconductor device in FIG. 14.

FIG. 14 is a partial plan view schematically illustrating a configuration of a semiconductor part of an MOSFET 103 (semiconductor device) according to Embodiment 3 of the present invention. In the drawing, the edges of the gate electrode 9 are indicated by dashed double-dotted lines. FIG. 15 is a partial plan view schematically illustrating a plan layout of the superjunction layer 90 of the MOSFET 103. The configuration illustrated in FIG. 14 is provided on this superjunction layer 90. The broken lines in FIGS. 14 and 15 indicate unit cells in the MOS structure.

In the present embodiment, the p-type pillars 4 (FIG. 15) have a plurality of pillar patterns as a plan layout, and the pillar patterns are arranged periodically along each of at least two directions. The at least two directions include two directions orthogonal to each other. Specifically, the pillar patterns of the p-type pillars 4 are arranged periodically along each of the X and Y directions.

In the illustrate example, the unit cells (broken lines in FIGS. 14 and 15) in the MOS structure have a square shape, but the shape of the unit cells is not limited to this example. The shape may be any quadrangle other than square, or may be any polygon other than quadrangle. In the case of a polygon, the shape may be a regular polygon, but is not limited thereto. As another alternative, the unit cells may have any shape other than polygons, such as a circle or an ellipse.

The configuration other than the above-described parts is substantially the same as the configuration described above in Embodiment 1. Thus, identical or corresponding constituent elements are given the same reference signs, and descriptions thereof are not repeated.

Manufacturing Method

First, a superjunction layer 90 that has a plan layout illustrated in FIG. 15 is formed. The method as used herein is similar to the steps in Embodiment 1 (FIGS. 6 to 10), except that the pattern is different.

Figure 16:
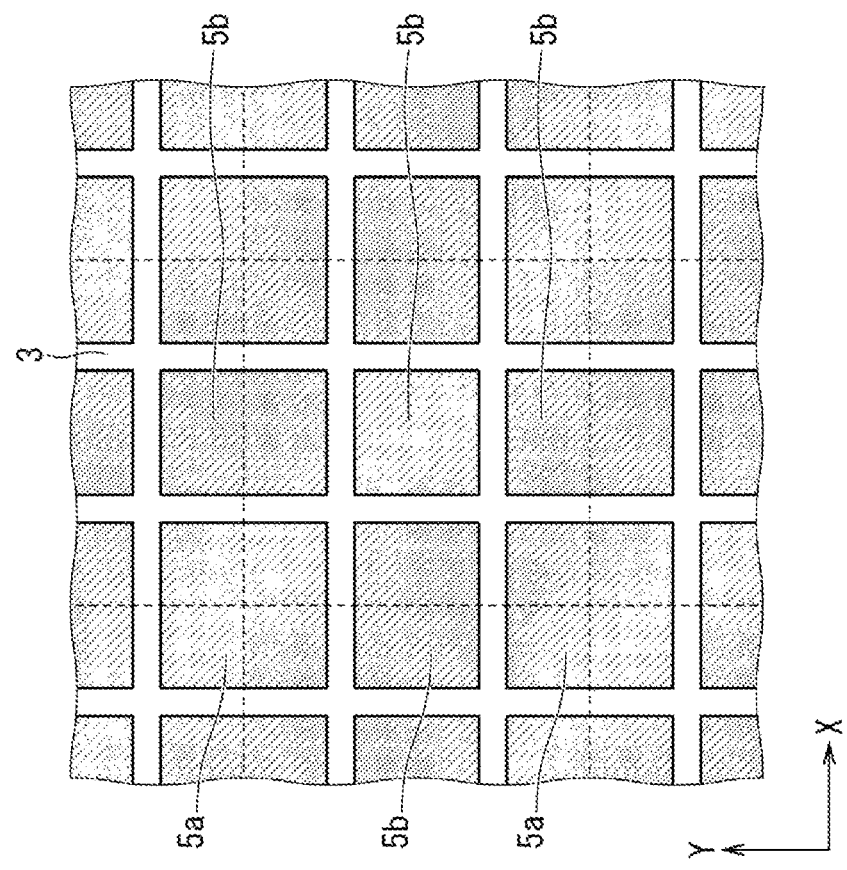
FIG. 16 is a partial plan view schematically illustrating a first step in a method of manufacturing the semiconductor device according to Embodiment 3 of the present invention.

Referring to FIG. 16, the first wells 5a and the second wells 5b are formed. The method as used herein is similar to the steps in Embodiment 1, except that the pattern is different. The shape of the first wells 5a (see FIG. 15) corresponds to the shape of the p-type pillars 4. The second wells 5b may have any shape as long as they can be arranged with efficiency on the n-type pillars 3 (FIG. 15), and may have a plurality of different shapes.

Figure 17:
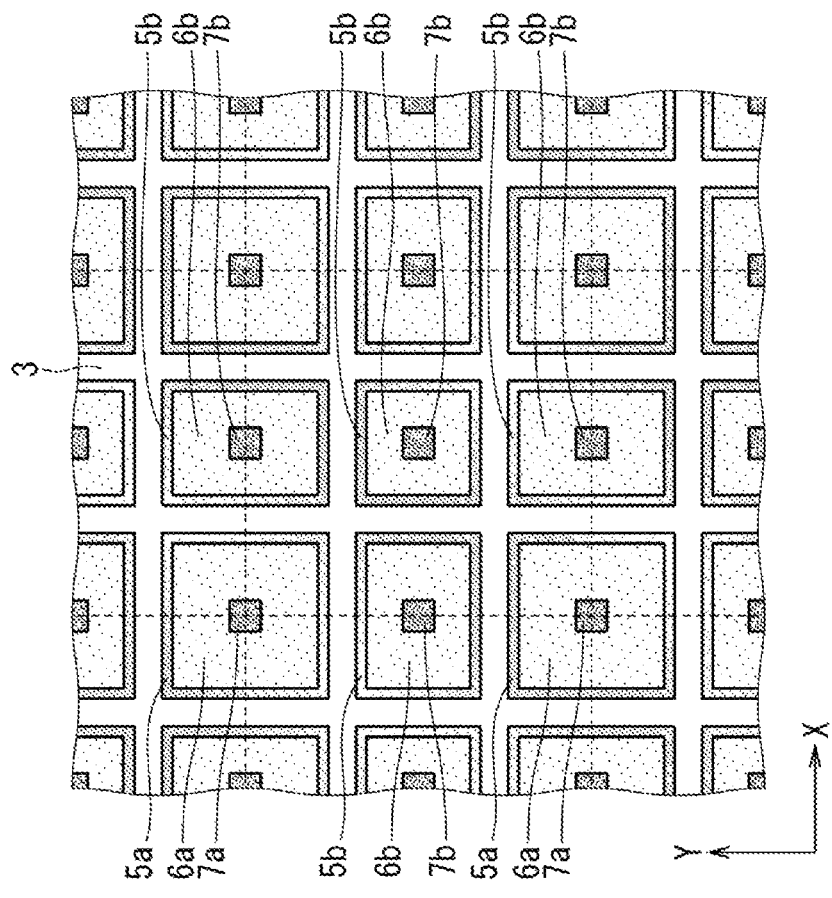
FIG. 17 is a partial plan view schematically illustrating a second step in the method of manufacturing the semiconductor device according to Embodiment 3 of the present invention.

Referring to FIG. 17, the first source regions 6a, the second source regions 6b, the contact region 7a, and the contact regions 7b are formed. The method as used herein is similar to the steps in Embodiment 1, except that the pattern is different.

Figure 18:
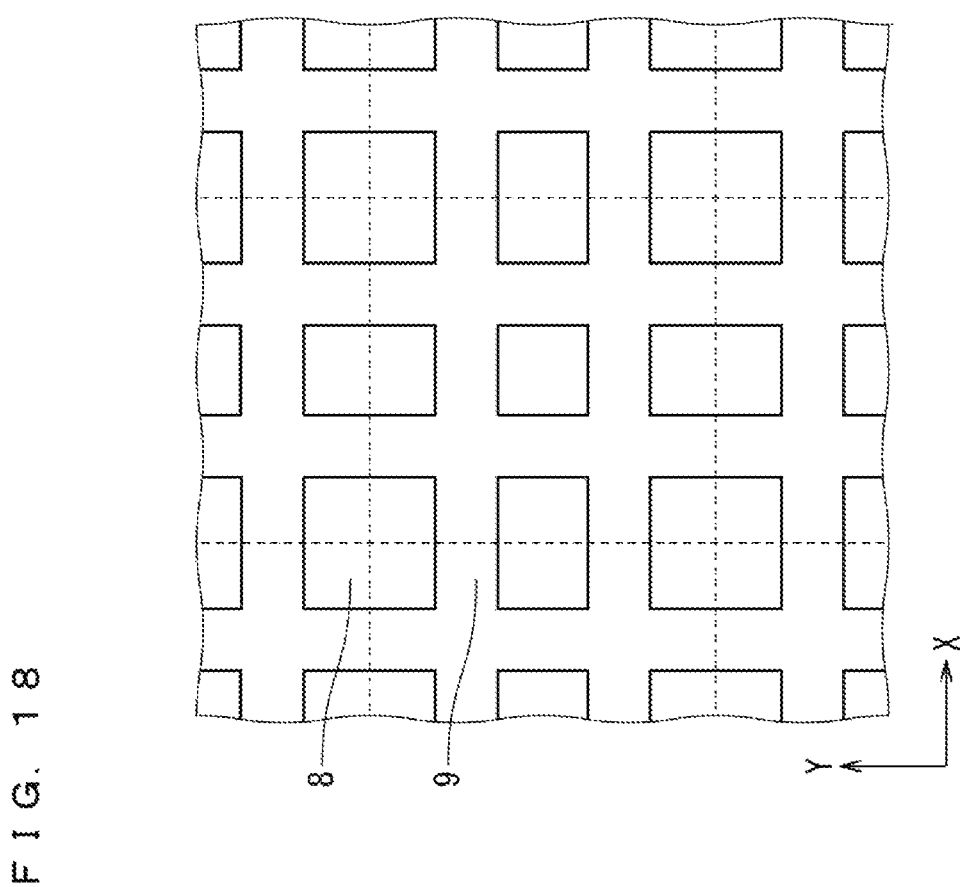
FIG. 18 is a partial plan view schematically illustrating a third step in the method of manufacturing the semiconductor device according to Embodiment 3 of the present invention.

Referring to FIG. 18, the gate insulation film 8 and polysilicon that forms the gate electrode 9 are deposited as in Embodiment 1. Then, the polysilicon is patterned so as to form the gate electrode 9. These methods are similar to the steps in Embodiment 1, except that the pattern is different. Thereafter, through similar steps to those of Embodiment 1, the MOSFET 103 is completed.

Effects

According to the present embodiment, the p-type pillars 4 have a plurality of pillar patterns as a plan layout (FIG. 15), and the pillar patterns are arranged periodically along each of at least two directions (specifically, X and Y directions). This further increases the density along the channel width as compared to that in the case where the p-type pillars 4 are arranged in stripes as in Embodiment 1 or 2. Accordingly, the on-resistance of the MOSFET can be further reduced.

In the present embodiment, the aforementioned two directions include X and Y directions, i.e., two directions orthogonal to each other. Accordingly, the p-type pillars 4 can be arranged in a simple orthogonal pattern as illustrated in FIG. 15.

Variation

Figure 19:
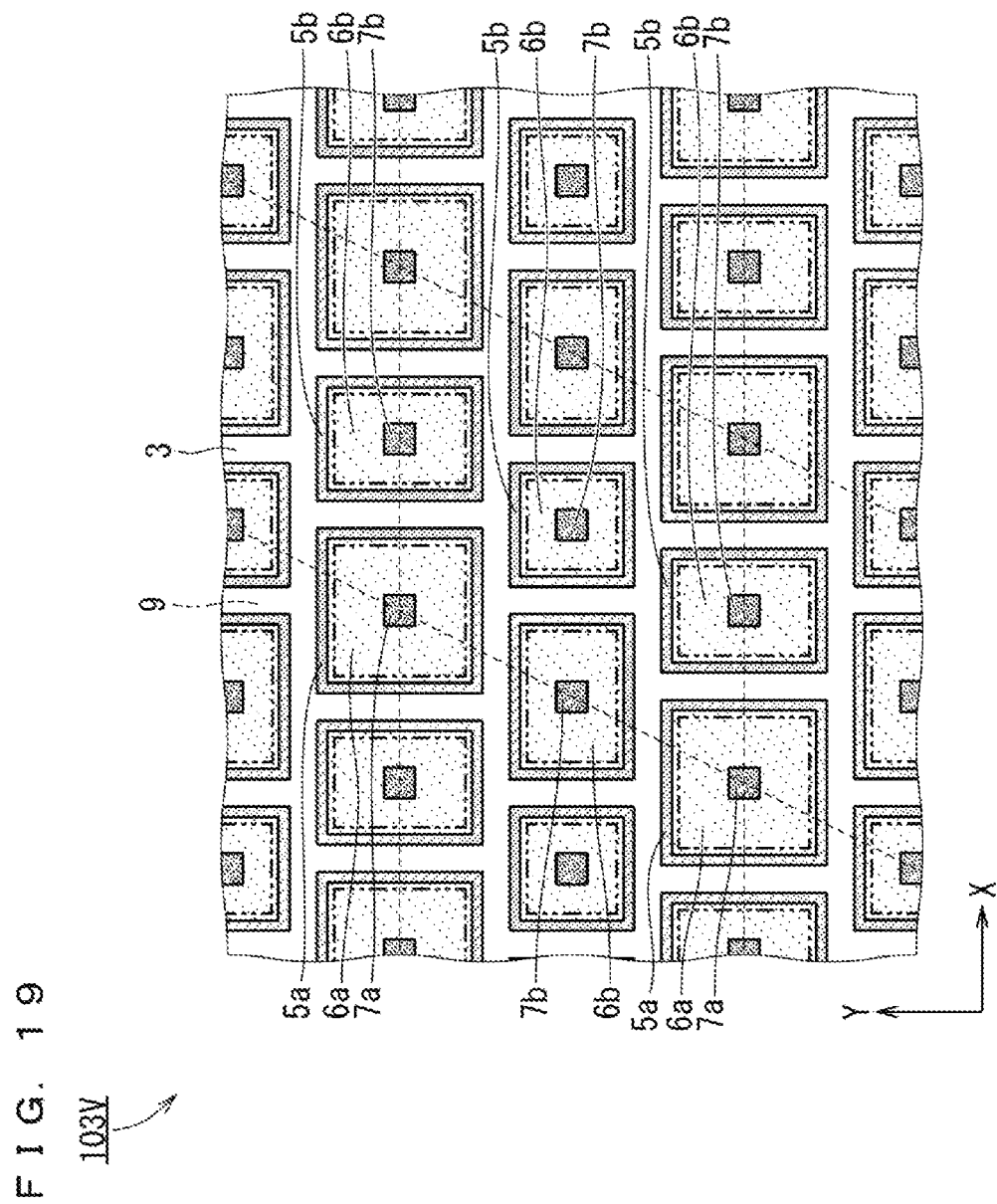
FIG. 19 illustrates a variation of FIG. 14.
Figure 20:
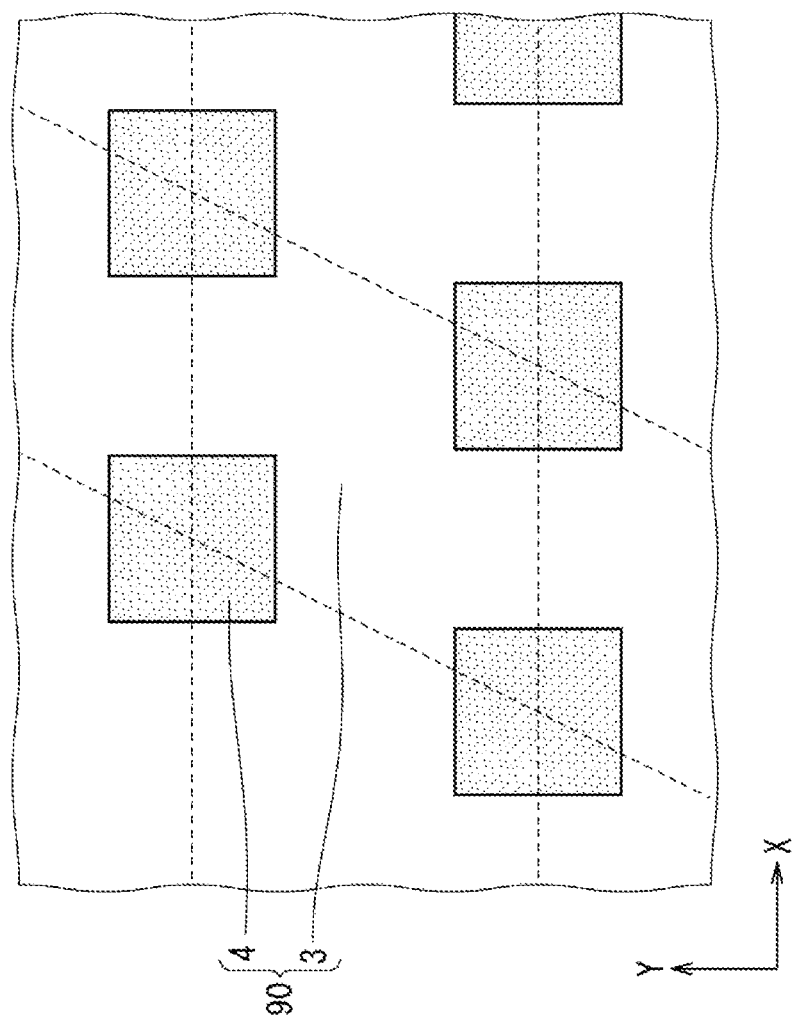
FIG. 20 illustrates a variation of FIG. 15.
Figure 21:
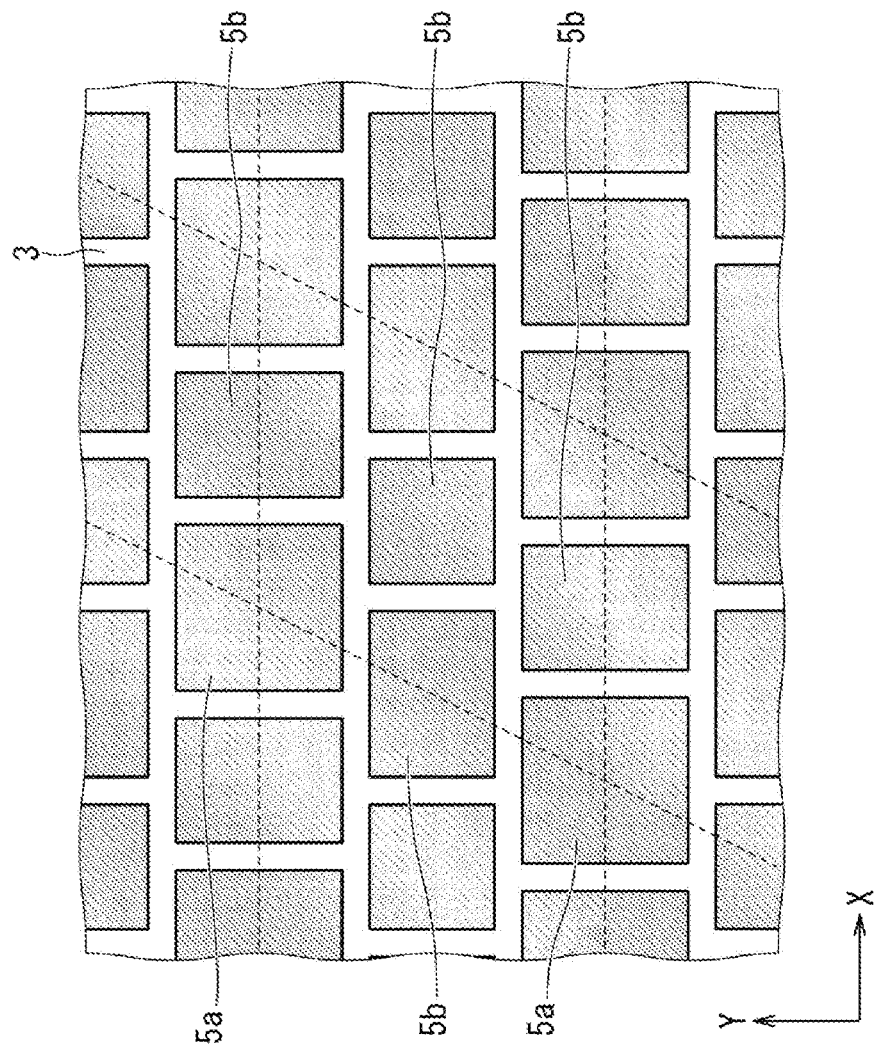
FIG. 21 illustrates a variation of FIG. 16.
Figure 22:
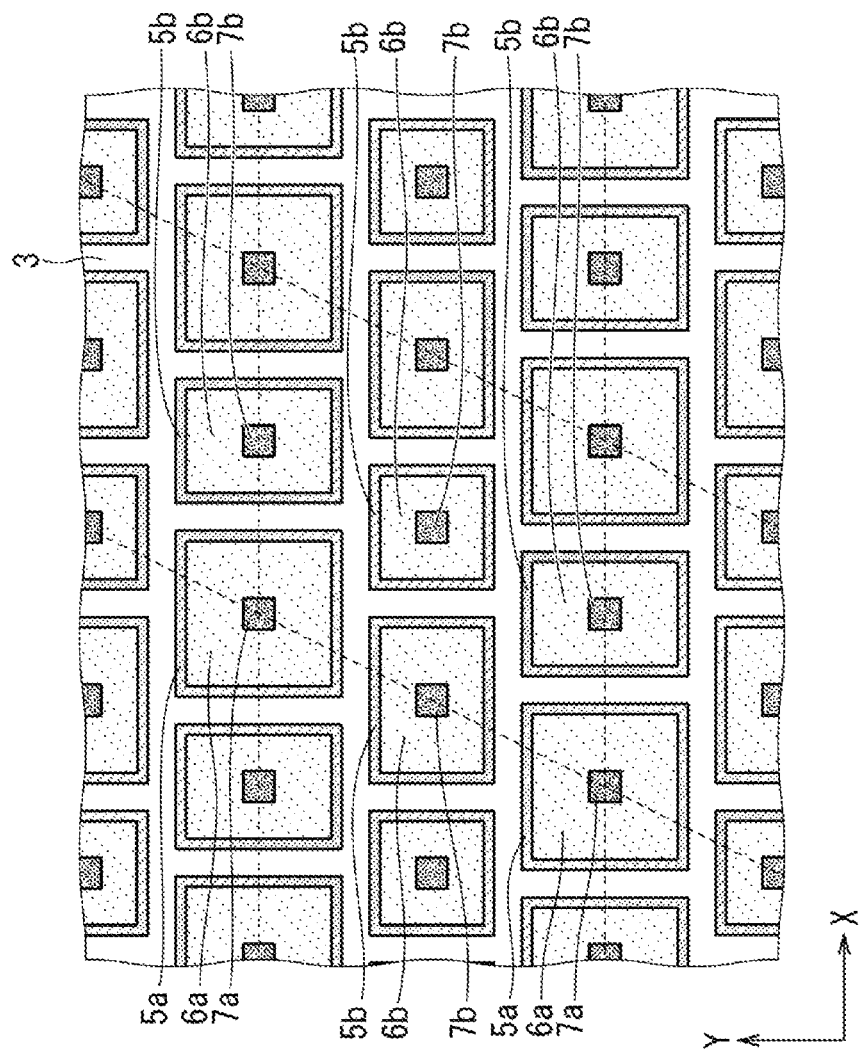
FIG. 22 illustrates a variation of FIG. 17.
Figure 23:
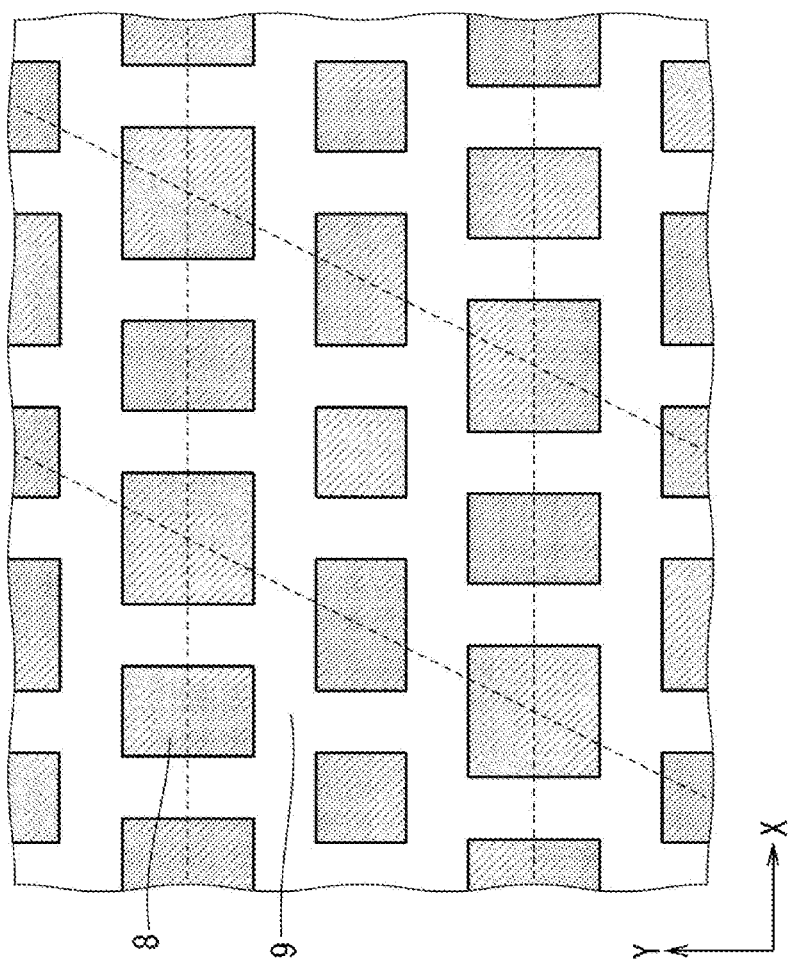
FIG. 23 illustrates a variation of FIG. 18.

FIG. 19 is a partial plan view schematically illustrating a configuration of a semiconductor part of an MOSFET 103V (semiconductor device) as a variation of the MOSFET 103 (FIG. 14). In the drawing, the edges of the gate electrode 9 are indicated by dashed double-dotted lines. FIG. 20 is a partial plan view schematically illustrating a plan layout of a superjunction layer 90 of the MOSFET 103V. The configuration illustrated in FIG. 19 is provided on this superjunction layer 90. The broken lines in FIGS. 19 and 20 indicate unit cells in the MOS structure.

According to the variation of the present embodiment, the pillar patterns of the p-type pillars 4 (FIG. 20) are arranged periodically along each of the X direction and a direction that extends diagonally with respect to the X direction (direction between the X and Y directions in FIG. 20). When viewed from a different viewpoint, the pillar patterns are arranged periodically along one direction (X direction in FIG. 20) and arranged in a staggered configuration along a direction (Y direction in FIG. 20) perpendicular to the one direction.

The method of manufacturing the MOSFET 103V is implemented by changing the plan layout used in the steps in FIGS. 15 to 18 to those in FIGS. 20 to 23.

This variation of the present embodiment can achieve a similar effect to that of Embodiment 3 described above.

Embodiment 4

Configuration

Figure 24:
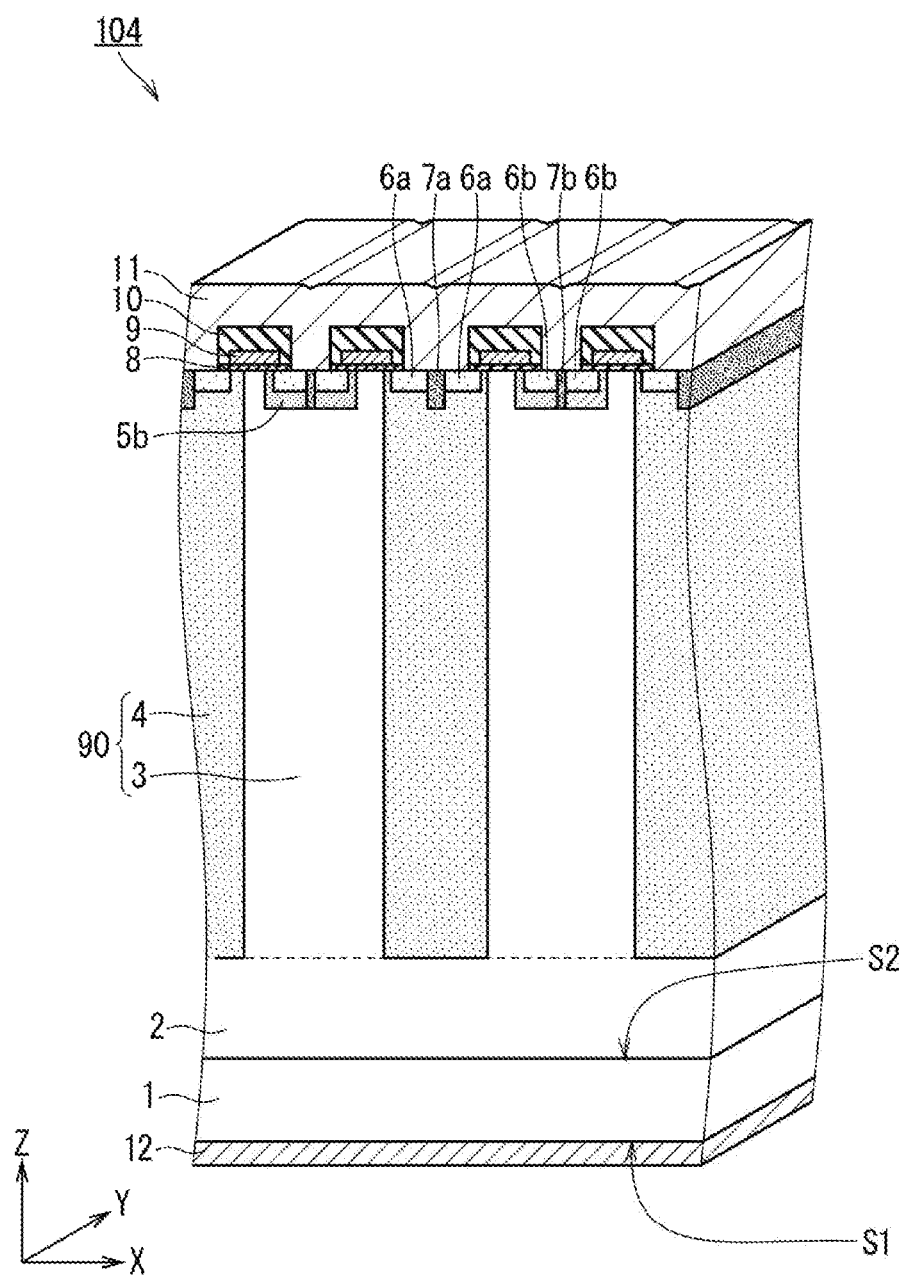
FIG. 24 is a sectional perspective view schematically illustrating a configuration of a semiconductor device according to Embodiment 4 of the present invention.
Figure 25:
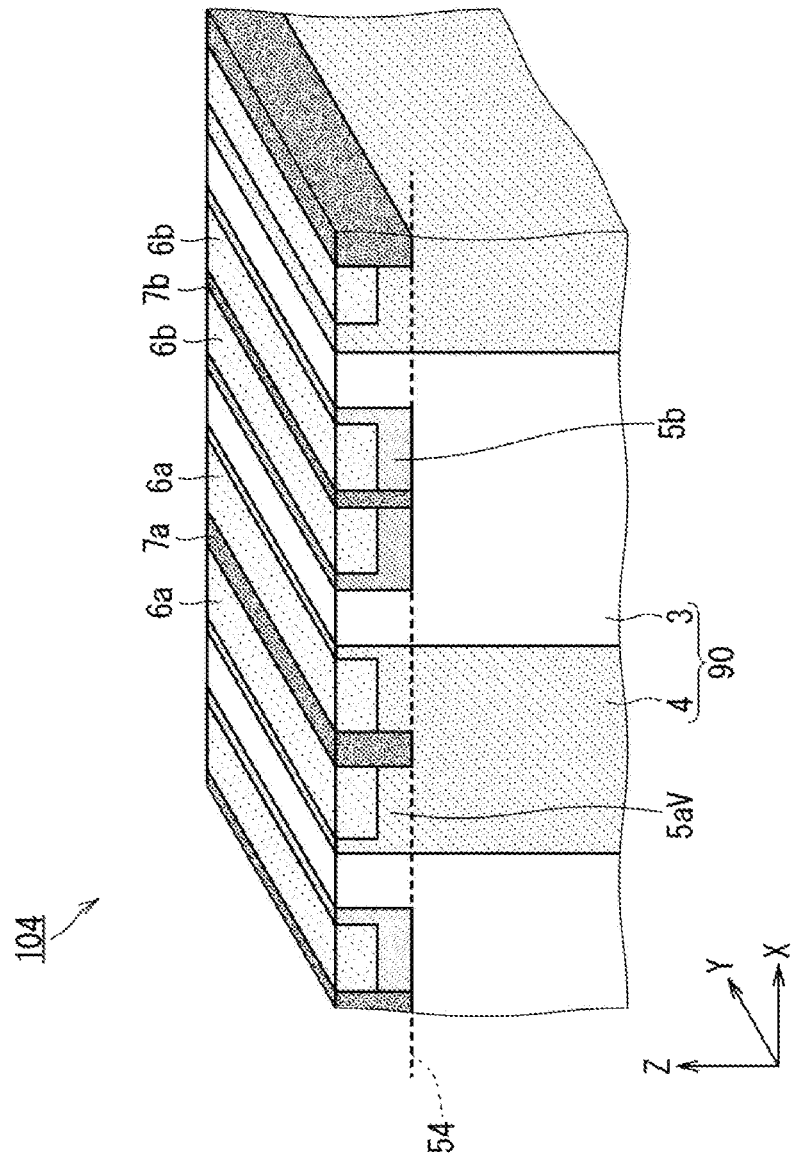
FIG. 25 is a partial enlarged view schematically illustrating a configuration of the structure of a semiconductor part in FIG. 24.

FIG. 24 is a sectional perspective view schematically illustrating a configuration of an MOSFET 104 (semiconductor device) according to Embodiment 4 of the present invention. FIG. 25 is a partial enlarged view schematically illustrating a configuration of the structure of a semiconductor part in FIG. 24.

The MOSFET 104 includes first wells 5aV (FIG. 25), instead of the first wells 5a of the MOSFETs 101 to 103 (Embodiments 1 to 3). The first wells 5aV have their edges on the boundaries between the n-type pillars 3 and the p-type pillars 4. Specifically, the positions of the edges of the first wells 5aV in the X direction in FIG. 25 are the same as the positions of the boundaries between the n-type pillars 3 and the p-type pillars 4.

The impurity concentration in the first wells 5aV may be the same as the impurity concentration in portions of the p-type pillars 4 that are in contact with the first wells 5aV (portions indicated by a broken line 54 in FIG. 25). In this case, the impurity concentration profile in the Z direction in FIG. 25 does not change at the boundaries between the p-type pillars 4 and the first wells 5aV. Thus, for example, the positions in the Z direction of the boundaries between the p-type pillars 4 and the first wells 5aV may be assumed to be the same as the positions in the Z direction of the boundaries between the n-type pillars 3 and the second wells (broken line 54 in FIG. 25).

The effective impurity concentration in the first wells 5aV may be the same as or different from the effective impurity concentration in the second wells 5b. In other words, the characteristics of channels formed by the first wells 5aV may be the same as or different from the characteristics of channels formed by the second wells 5b.

The configuration other than the above-described parts is substantially the same as the configurations described above in Embodiments 1 to 3 and the variations. Thus, identical or corresponding constituent elements are given the same reference signs, and descriptions thereof are not repeated.

Manufacturing Method

In the present embodiment, after the step of forming the superjunction layer 90 (FIG. 10), surface portions of the p-type pillars 4 are used as-is as the first wells 5aV (FIG. 25). Thus, unlike in Embodiments 1 to 3, the ion implantation step for forming the first wells is omitted. The other steps are similar to those in Embodiment 1.

Effects

According to the present embodiment, the first wells 5aV have their edges on the boundaries between the n-type pillars 3 and the p-type pillars 4. Accordingly, the pattern of the first wells can be formed using the patterns of the n-type pillars 3 and the p-type pillars 4. This eliminates the need to perform patterning for forming the first wells 5aV after the formation of the p-type pillars 4. Accordingly, errors do not occur in channel length due to misregistration during the patterning. In Embodiments 1 to 3 described above, on the other hand, errors occur in channel length due to misregistration between the patterning of the first source regions 6a and the patterning of the first wells 5a. The present embodiment can reduce such errors in channel length. Accordingly, MOS structures can be arranged at higher densities. It is thus possible to increase the density along the channel width and to further reduce the on-resistance of the MOSFET 101.

The impurity concentration in the first wells 5*a*V may be the same as the impurity concentration in the portions of the p-type pillars 4 that are in contact with the first wells 5*a*V. In that case, when an epitaxial layer that forms the p-type pillars 4 and the first wells 5*a*V (see FIG. 9) is formed, it is no longer necessary to give special consideration to which parts of the epitaxial layer are used to form the first wells 5*a*V.

Embodiment 5

Configuration

Figure 26:
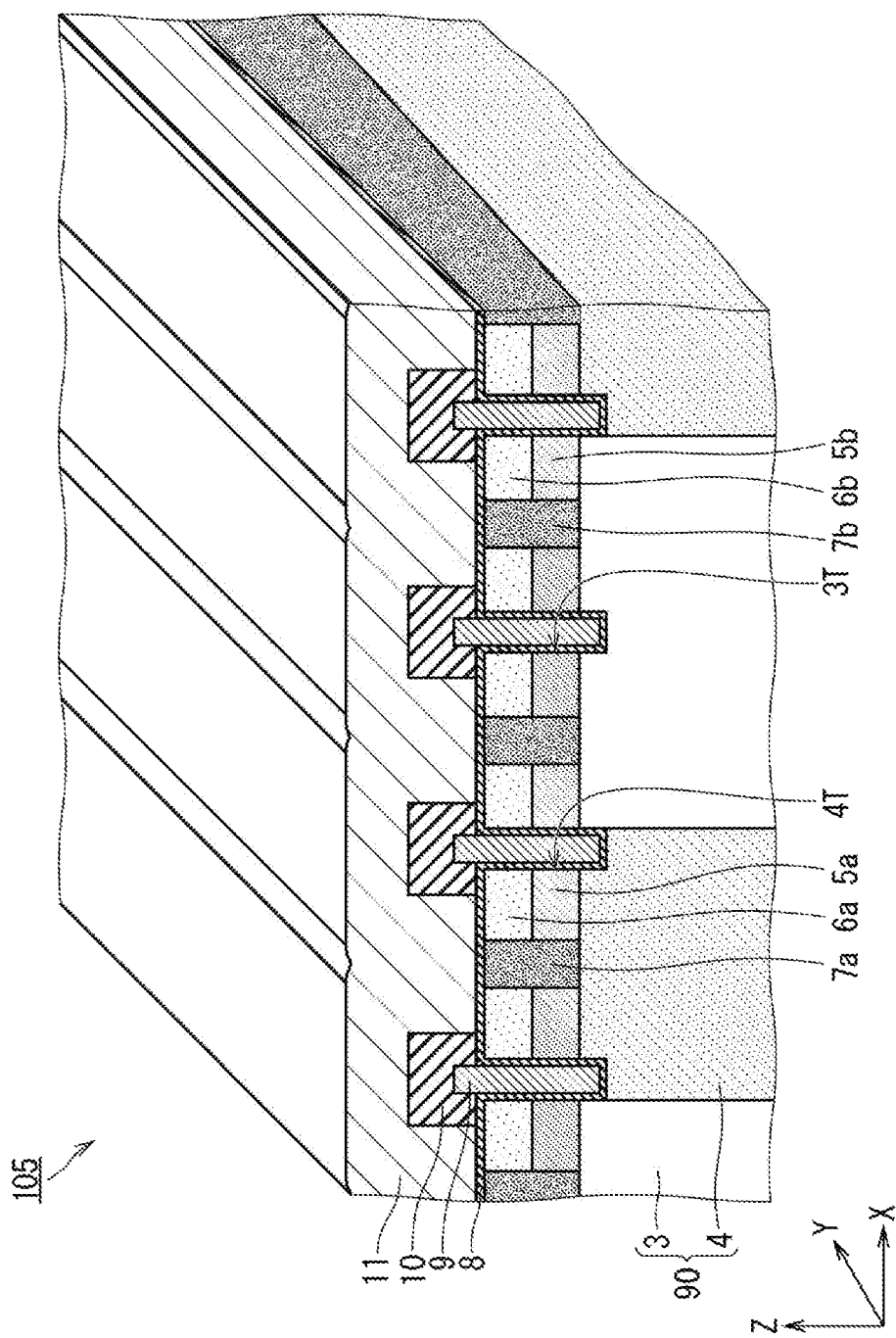
FIG. 26 is a sectional perspective view schematically illustrating a configuration of a semiconductor device according to Embodiment 5 of the present invention.

FIG. 26 is a sectional perspective view schematically illustrating a configuration of an MOSFET 105 (semiconductor device) according to Embodiment 5 of the present invention. While the planar gate type MOSFETs 101 to 104 have been described above in Embodiments 1 to 4, the MOSFET 105 according to the present embodiment is of a trench gate type. By adopting the trench gate type, it is possible to further increase the density along the channel width. Accordingly, the on-resistance of the MOSFET can be further reduced.

The MOSFET 105 includes trenches 3T and trenches 4T. The trenches 3T are provided on the n-type pillars 3 and separated from the p-type pillars 4. The trenches 4T are provided in contact with the n-type pillars 3 above the p-type pillars 4.

The trenches 3T have side walls that pass through the second source regions 6*b* and the second wells 5*b* and reach the n-type pillars 3. Thus, gate electrode structures provided in the trenches 3T can form channels on the side walls formed by the second wells 5*b*.

Similarly to the trenches 3T, the trenches 4T have side walls that pass through the second source regions 6*b* and the second wells 5*b* and reach the n-type pillars 3. This structure forms channels in the same manner as in the case of the trenches 3T.

The trenches 4T also have side walls that pass through the first source regions 6*a* and the first wells 5*a* and reach the p-type pillars 4. The trenches 4T also have bottom surfaces that face the p-type pillars 4 and reach the n-type pillars 3. Thus, the trenches 4T have inner surfaces that join the first source regions 6*a*, the first wells 5*a*, the p-type pillars 4, and the n-type pillars 3 in sequence. Accordingly, gate electrode structures provided in the trenches 4T also form channels in serial electrical paths of the first wells 5*a* and the p-type pillars 4 that form the inner surfaces.

The configuration other than the above-described parts is substantially the same as one of the configurations described above in Embodiments 1 to 4 and the variations. Thus, identical or corresponding constituent elements are given the same reference signs, and descriptions thereof are not repeated.

Manufacturing Method

First, the superjunction layer 90 is formed by similar steps to those in FIGS. 6 to 10 (Embodiment 1).

Figure 27:
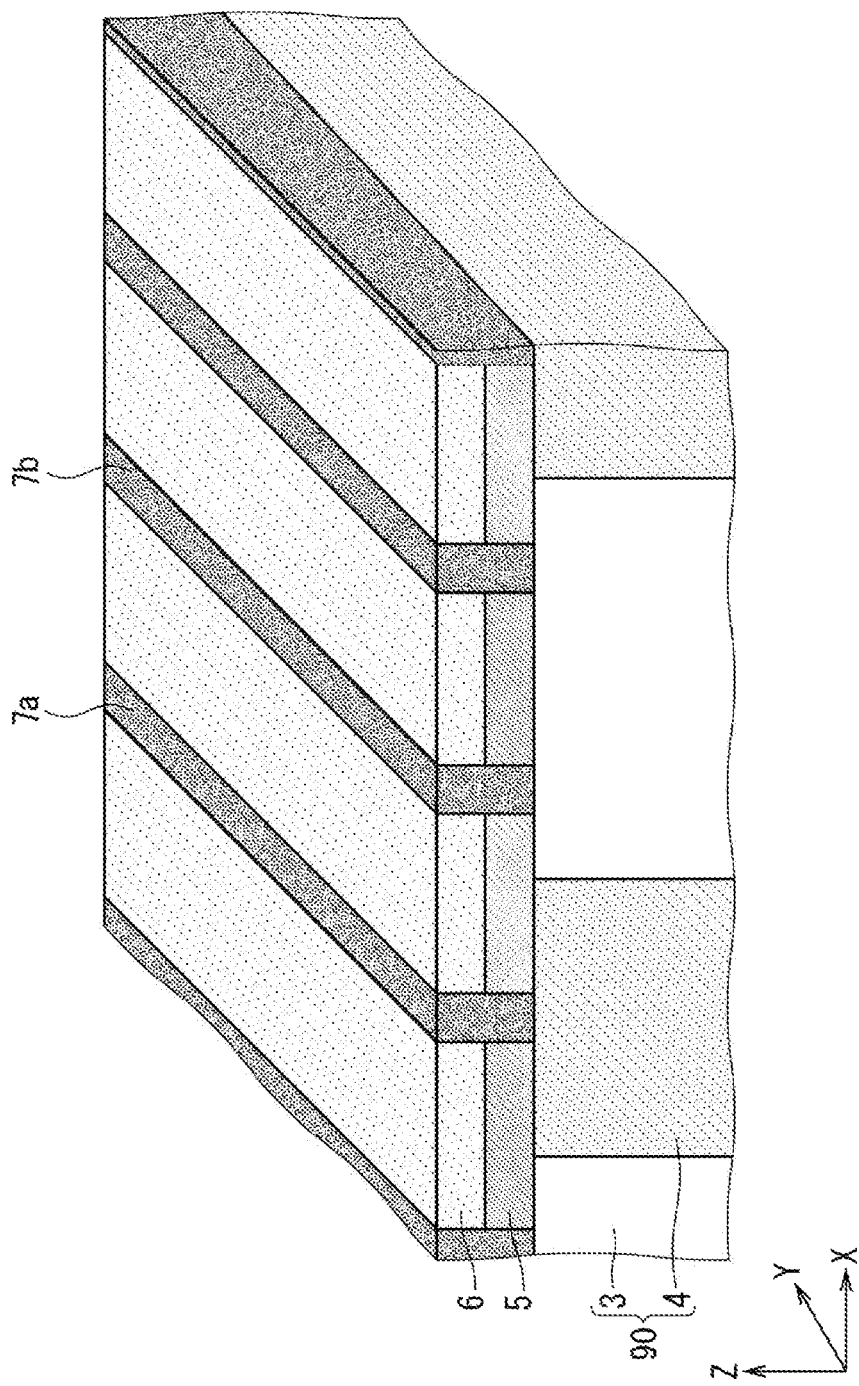
FIG. 27 is a sectional perspective view schematically illustrating a first step in a method of manufacturing the semiconductor device according to Embodiment 5 of the present invention.

Referring to FIG. 27, an impurity layer 5 that forms the first wells 5*a* and the second wells 5*b* and an impurity layer 6 that forms the first source regions 6*a* and the second source regions 6*b* are formed on the superjunction layer 90 by ion implantation. Also, the contact regions 7*a* and the contact regions 7*b* are formed by ion implantation using, for example, a resist mask processed by a photoengraving process. Then, implanted impurities are activated by heat treatment.

Figure 28:
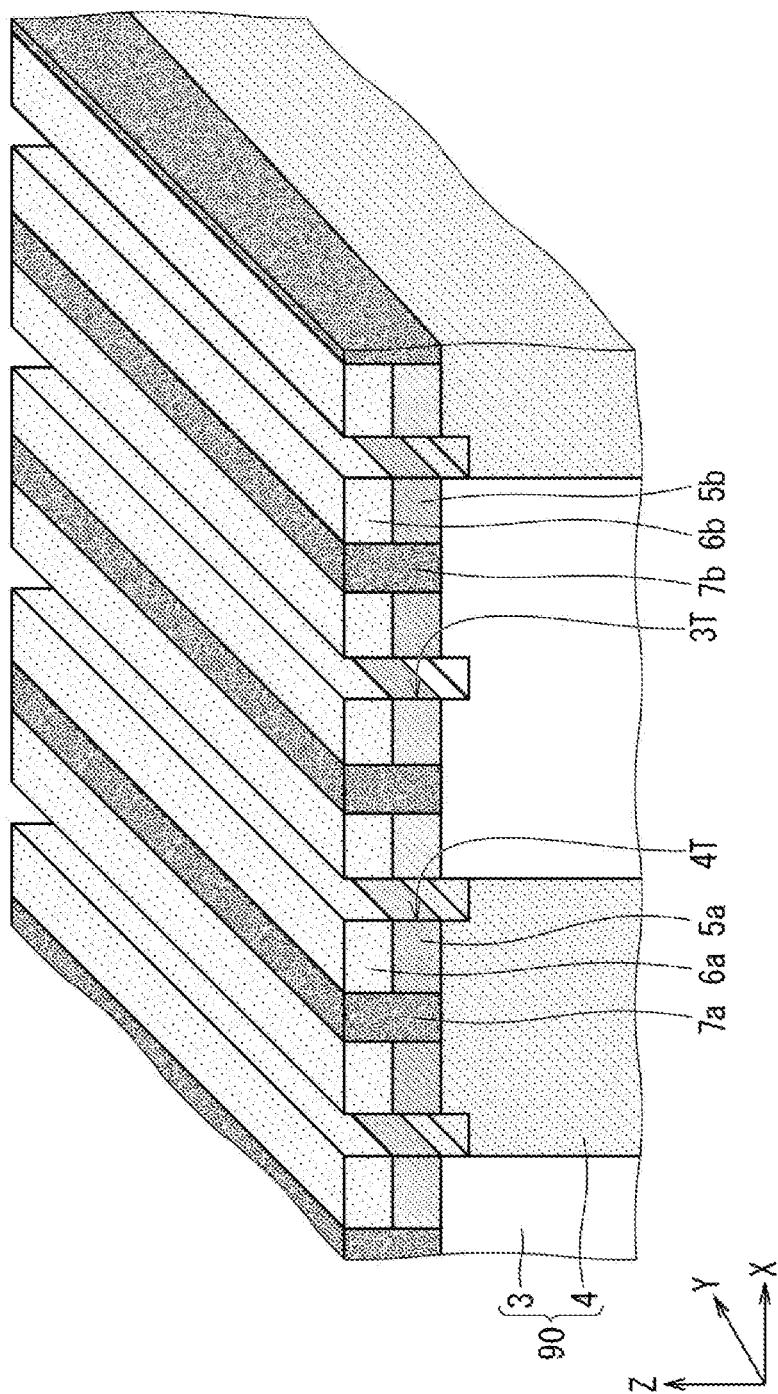
FIG. 28 is a sectional perspective view schematically illustrating a second step in the method of manufacturing the semiconductor device according to Embodiment 5 of the present invention.

Referring to FIG. 28, the trenches 3T and the trenches 4T are formed in the wafer surface by, for example, dry etching using an oxide-film mask or the like. As a result, the impurity layer 5 (FIG. 27) is divided into the first wells 5*a* in the p-type pillars 4 and the second wells 5*b* in the n-type pillars 3. The impurity layer 6 (FIG. 27) is also divided into the first source regions 6*a* in the first wells 5*a* and the second source regions 6*b* in the second wells 5*b*. Note that the aforementioned activation step may be performed after this trench forming step. Thereafter, a field insulation film (not shown) is formed as in Embodiment 1.

Figure 29:
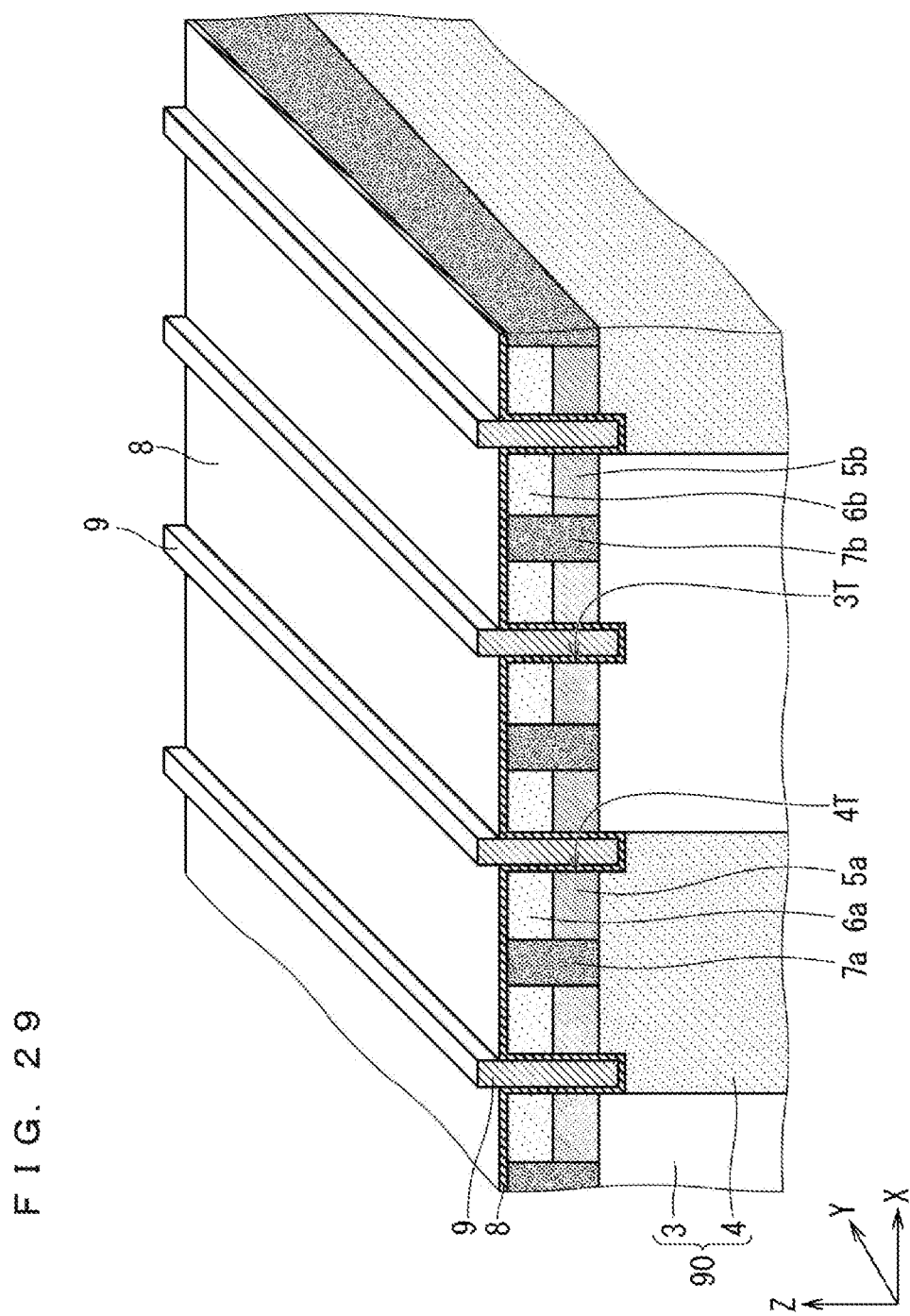
FIG. 29 is a sectional perspective view schematically illustrating a third step in the method of manufacturing the semiconductor device according to Embodiment 5 of the present invention.

Referring to FIG. 29, the gate insulation film 8 and polysilicon are deposited on the wafer surface by, for example, CVD. Then, unnecessary portions of the polysilicon are removed so as to form the gate electrode 9 of the polysilicon in the trenches 3T and 4T. This removal is implemented by using, for example, a resist mask processed by a photoengraving process. The surface level of the gate electrode 9 is preferably slightly higher than the wafer surface level as illustrated in the drawing, but may be lower than the wafer surface level. Thereafter, through similar steps to those of Embodiment 1, the MOSFET 105 is completed.

Embodiment 6

Configuration

Figure 30:
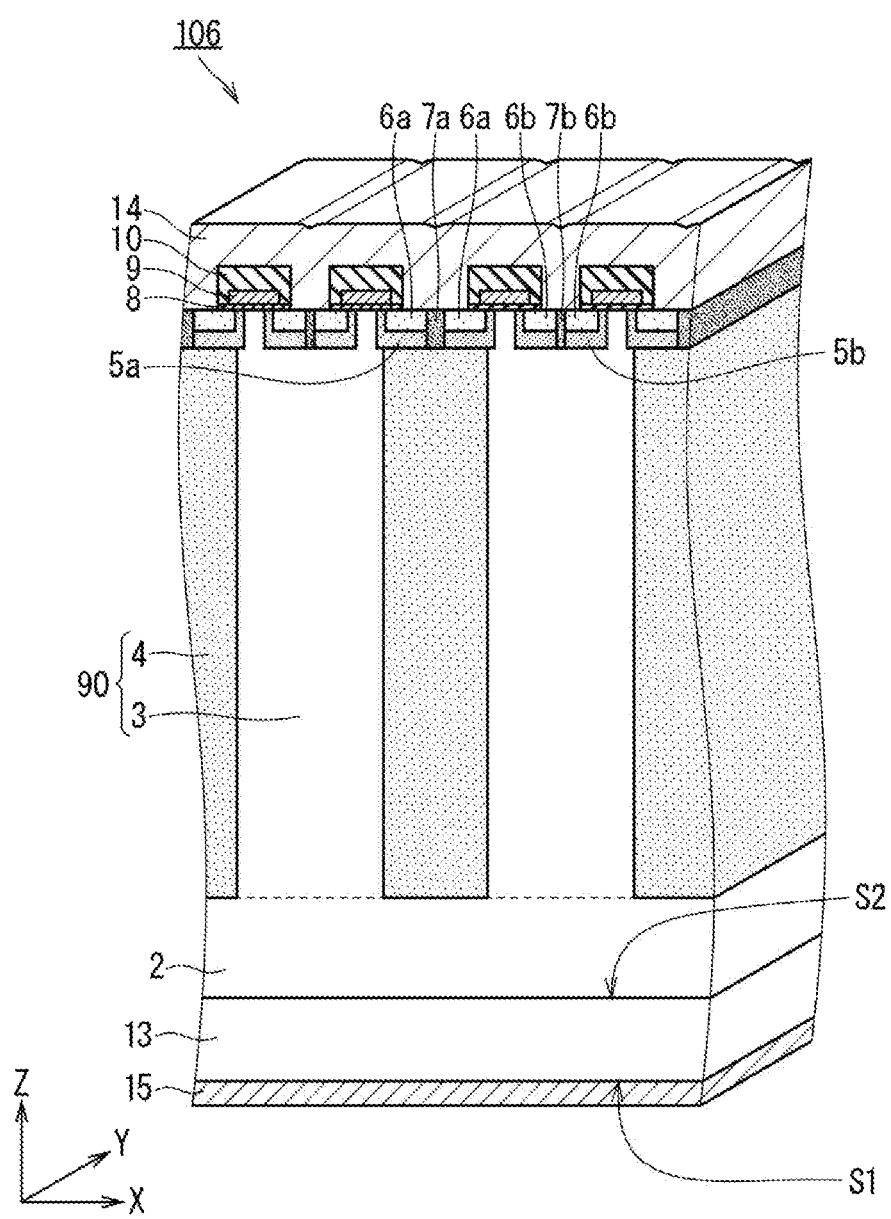
FIG. 30 is a sectional perspective view schematically illustrating a configuration of a semiconductor device according to Embodiment 6 of the present invention.

FIG. 30 is a sectional perspective view schematically illustrating a configuration of an IGBT 106 (semiconductor device) according to Embodiment 6 of the present invention. While Embodiments 1 to 5 have described above the MOSFETs 101 to 105, the present embodiment describes an IGBT as a semiconductor device. By using an IGBT as a semiconductor device, it is possible to expect a further improvement in withstand voltage and a further reduction in resistance.

The IGBT 106 includes a p$^+$ layer 13 (semiconductor layer) having a lower surface S1 and an upper surface S2, instead of the semiconductor substrate 1 of the MOSFET 101 (FIG. 1: Embodiment 1). The p$^+$ layer 13 has a conductivity type (second conductivity type different from the first conductivity type) different from the conductivity type of the n-type pillars 3. The acceptor concentration in the p$^+$ layer 13 is desirably in the range of $1 \times 10^{18}$ cm$^{-3}$ to $1 \times 10^{21}$ cm$^{-3}$. The IGBT 106 also includes an emitter electrode 14 and a collector electrode 15, instead of the source electrode 11 and the drain electrode 12 (FIG. 1).

The configuration other than the above-described parts is substantially the same as the configurations described above in Embodiments 1 to 5 and the variations. Thus, identical or corresponding constituent elements are given the same reference signs, and descriptions thereof are not repeated.

Manufacturing Method

Figure 31:
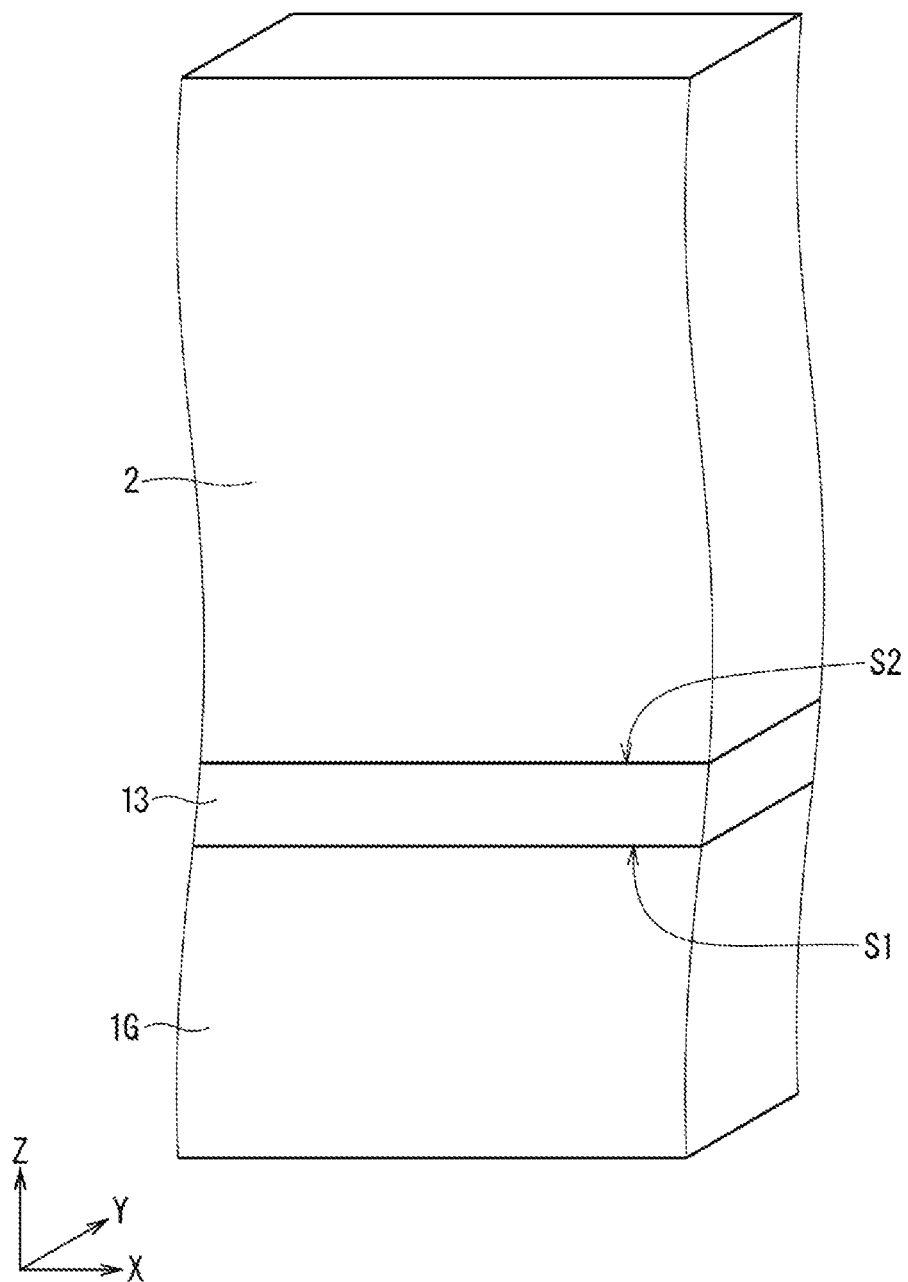
FIG. 31 is a sectional perspective view schematically illustrating a first step in a method of manufacturing the semiconductor device according to Embodiment 6 of the present invention.
Figure 32:
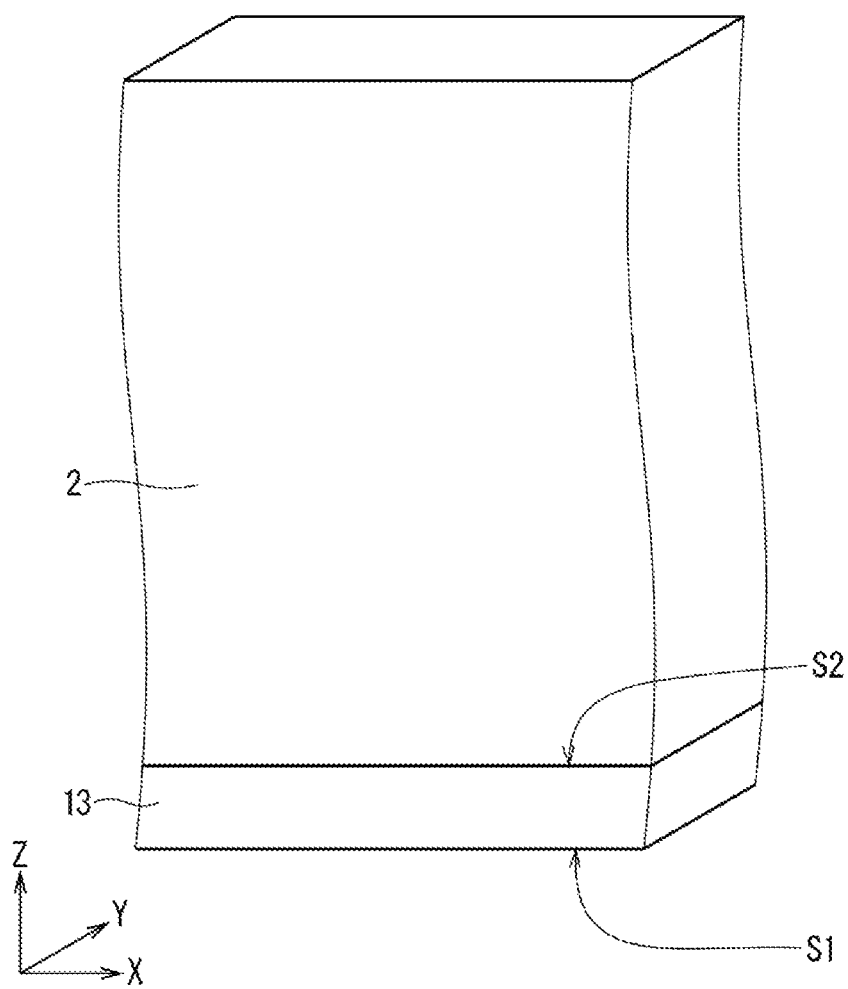
FIG. 32 is a sectional perspective view schematically illustrating a second step in the method of manufacturing the semiconductor device according to Embodiment 6 of the present invention.

FIGS. 31 and 32 are sectional perspective views schematically illustrating first and second steps in the method of manufacturing the IGBT 106.

Referring to FIG. 31, a single-crystal substrate 1G is prepared. The conductivity type of the single-crystal substrate 1G may be an n-type. The p$^+$ layer 13 is formed on the single-crystal substrate 1G. The p$^+$ layer 13 has the lower surface S1 that faces the single-crystal substrate 1G, and the upper surface S2 opposite to the lower surface S1. The p$^+$ layer 13 is preferably formed by epitaxial growth, but may be formed by ion implantation. Thereafter, an epitaxial layer 2 is formed by epitaxial growth on the upper surface S2 of the p⁺ layer 13. Thereafter, the single-crystal substrate 1G is removed by, for example, polishing as illustrated in FIG. 32. Thereafter, through similar steps to those of Embodiment 1, the IGBT 106 is completed. The methods of forming the emitter electrode 14 and the collector electrode 15 are similar to the methods of forming the source electrode 11 and the drain electrode 12.

As a variation, in the step of FIG. 6 in Embodiment 1, a p-type (second conductivity type) semiconductor substrate may be used, instead of the n-type (first conductivity type) semiconductor substrate 1. In this case, the p-type semiconductor substrate can be used as the p⁺ layer 13 (FIG. 30), and therefore an IGBT can be manufactured through almost similar steps to those of Embodiment 1. This eliminates the step of removing the single-crystal substrate 1G (FIG. 31).

Embodiment 7

Configuration

Figure 33:
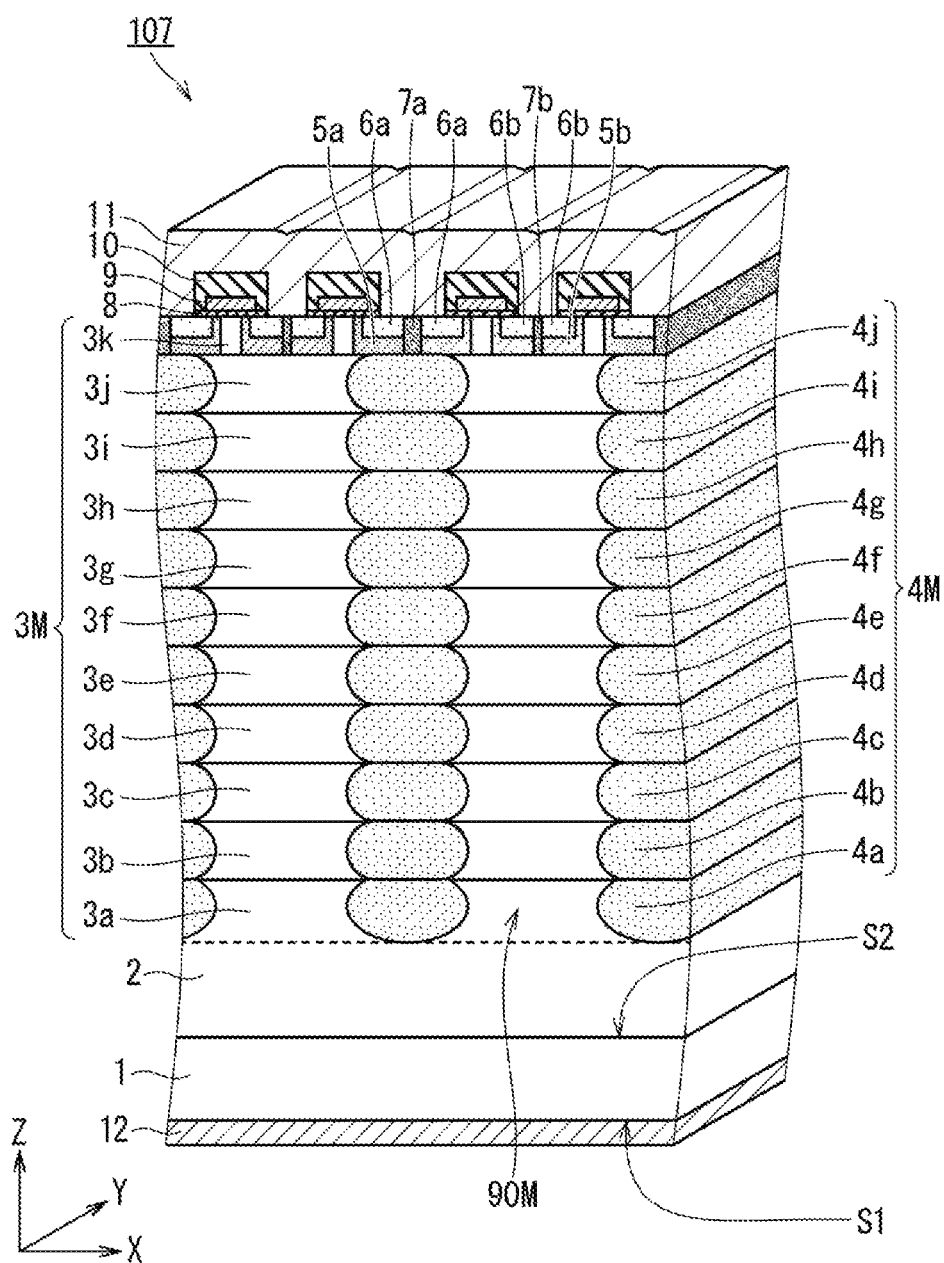
FIG. 33 is a sectional perspective view schematically illustrating a configuration of a semiconductor device according to Embodiment 7 of the present invention.

FIG. 33 is a sectional perspective view schematically illustrating a configuration of an MOSFET 107 (semiconductor device) according to Embodiment 7 of the present invention. While Embodiments 1 to 6 have described above the cases in which the superjunction layers 90 are formed by an embedded epitaxial method, a superjunction layer 90M of the MOSFET 107 according to the present embodiment is formed by a multi-epitaxial method. By using the multi-epitaxial method, the pillar pitch can be further reduced. Accordingly, it is possible to further increase the density along the channel width and to further reduce the on-resistance of the MOSFET.

The superjunction layer 90M includes n-type pillars 3M and p-type pillars 4M, instead of the n-type pillars 3 and the p-type pillars 4 in the superjunction layer 90 (FIG. 1). The p-type pillars 4M include implantation regions 4a to 4j that are provided in this order on the epitaxial layer 2. The n-type pillars 3M include stacked regions 3a to 3k that are provided in this order on the epitaxial layer 2. The implantation regions 4a to 4j respectively oppose the stacked regions 3a to 3j in the in-plane direction (X direction in FIG. 33).

The operations of the MOSFET 107 are substantially the same as those of the MOSFET 101 (FIG. 1: Embodiment 1).

The configuration other than the above-described parts is substantially the same as one of the configurations described above in Embodiments 1 to 5 and the variations. Thus, identical or corresponding constituent elements are given the same reference signs, and descriptions thereof are not repeated. An IGBT may be obtained by applying the present embodiment to Embodiment 6 or variations thereof described above.

Manufacturing Method

Figure 34:
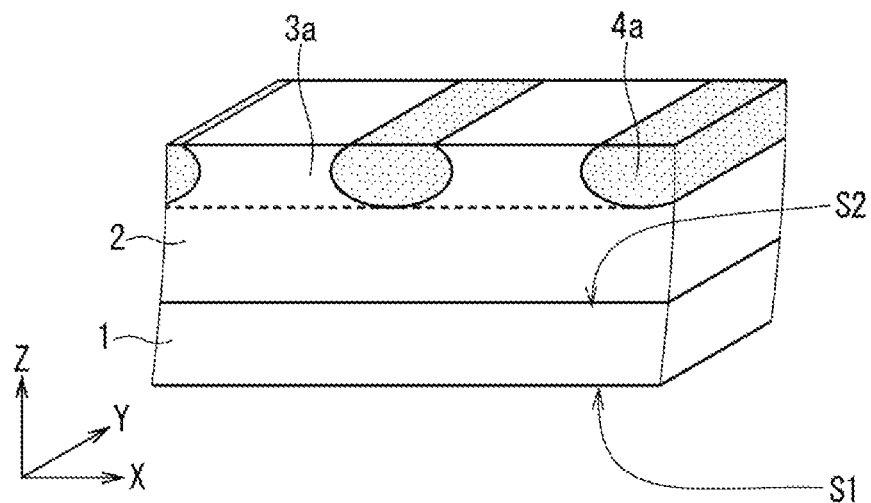
FIG. 34 is a sectional perspective view schematically illustrating a first step in a method of manufacturing the semiconductor device according to Embodiment 7 of the present invention.
Figure 35:
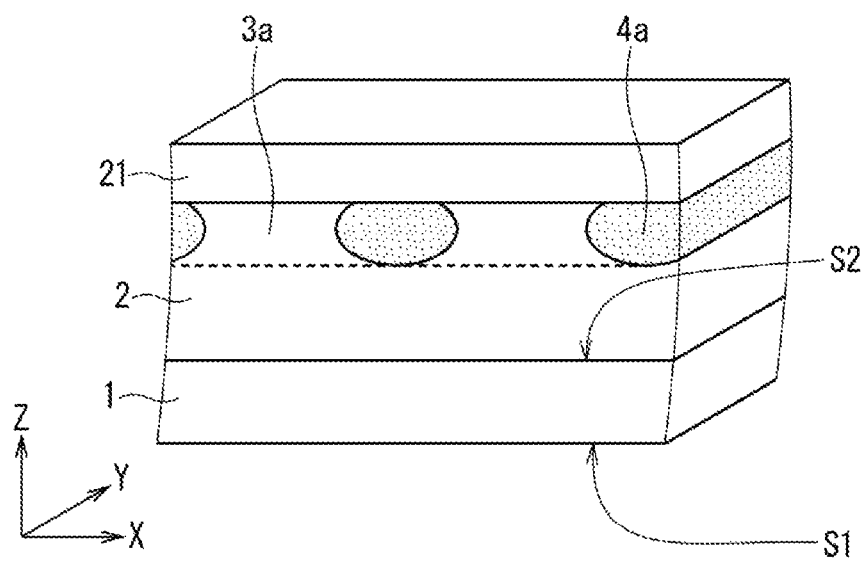
FIG. 35 is a sectional perspective view schematically illustrating a second step in the method of manufacturing the semiconductor device according to Embodiment 7 of the present invention.

FIGS. 34 to 36 are sectional perspective views schematically illustrating first to third steps in the method of manufacturing the MOSFET 107.

Referring to FIG. 34, first, the n-type epitaxial layer 2 is formed by epitaxial growth on the semiconductor substrate 1. Thereafter, the p-type implantation regions 4a are selectively formed by ion implantation on the surface of the epitaxial layer 2. Portions that remain n-type and that oppose the implantation regions 4a in the X direction become the stacked regions 3a. The thickness of the implantation regions 4a is usually less than or equal to 5 μm. The acceleration voltage of an ion implantation device that is ordinarily used at the present time is approximately 8 MeV at the maximum, and in that case, the implantation regions 4a with a thickness of approximately 4 μm are formed at once.

Referring to FIG. 35, after the above ion implantation, an n-type epitaxial growth layer 21 is formed by epitaxial growth on the surfaces of the implantation regions 4a and the stacked regions 3a. For the aforementioned reason, the thickness of the epitaxial growth layer 21 is assumed to be less than or equal to 5 μm. The donor concentration in the epitaxial growth layer 21 is desirably the same as the donor concentration in the stacked regions 3a, i.e., the donor concentration in the epitaxial layer 2.

Referring to FIG. 36, the p-type implantation regions 4b are selectively formed by ion implantation into the epitaxial growth layer 21. The acceptor concentration in the implantation regions 4b is desirably equivalent to the acceptor concentration in the implantation regions 4a. The implantation regions 4b are disposed on the implantation regions 4a. In other words, the implantation regions 4b are stacked on the implantation regions 4a in the thickness direction (Z direction in the drawing).

After this, the epitaxial growth described with reference to FIG. 35 and the ion implantation described with reference to FIG. 36 are repeated so as to obtain the superjunction layer 90M (FIG. 33). Thereafter, through similar steps to those of Embodiment 1, the MOSFET 107 (FIG. 33) is completed. In FIG. 33, the implantation regions 4a to 4j are formed by repeating the epitaxial growth and the ion implantation 10 times, but the number of repetitions may be appropriately changed depending on the thickness of the superjunction layer 90M that satisfies a desired withstand voltage.

It should be noted that the present invention can be implemented by freely combining each of the embodiments or by making a modification or omission on the embodiments as appropriate without departing from the scope of the present invention. While the invention has been shown and described in detail, the foregoing description is in all aspects illustrative and not restrictive. It is therefore to be understood that numerous modifications and variations can be devised without departing from the scope of the invention.

Explanation of Reference Signs

S1: lower surface (first surface), S2: upper surface (second surface), 1: semiconductor substrate (semiconductor layer), 1G: single-crystal substrate, 3, 3M: n-type pillars (first pillars), 3a to 3k: stacked regions, 4, 4M: p-type pillars (second pillars), 4a to 4j: implantation regions, 5, 6: impurity layer, 5a, 5aV: first wells, 5b: second wells, 6a: first source regions (first impurity regions), 6b: second source regions (second impurity regions), 7a, 7b: contact regions, 8: gate insulation film, 9: gate electrode (control electrode), 10: interlayer insulation film, 10a, 10b, 10bV: contact holes, 11: source electrode (second main electrode), 12: drain electrode (first main electrode), 14: emitter electrode (second main electrode), 15: collector electrode (first main electrode), 21: epitaxial growth layer, 61L: oxide film, 61M: oxide-film mask, 62: resist mask, 90, 90M: superjunction layer, 100A: active region, 100N: non-active region, 101 to 105, 103V,107: MOSFETs (semiconductor devices), 106: IGBT (semiconductor device).

The invention claimed is:

1. A semiconductor device including an active region that includes a switchable current path, comprising:
    a semiconductor layer of a first conductivity type having a first surface and a second surface opposite to the first surface;

a first main electrode provided on the first surface;

a superjunction layer provided on the second surface of the semiconductor layer and consisting of a plurality of first pillars of the first conductivity type and a plurality of second pillars of a second conductivity type different from the first conductivity type in a section of the active region that is perpendicular to the second surface of the semiconductor layer, the plurality of first pillars and the plurality of second pillars being alternately aligned in an in-plane direction of the second surface, the first pillars having a constant impurity concentration and the second pillars having a constant impurity concentration;

a plurality of first wells of the second conductivity type provided respectively on the plurality of second pillars and reaching the first pillars on the superjunction layer;

a plurality of first impurity regions of the first conductivity type provided respectively on the plurality of first wells and separated from the first pillars by the first wells;

a plurality of second wells of the second conductivity type provided respectively on the plurality of first pillars and disposed spaced from the second pillars in the section;

a plurality of second impurity regions of the first conductivity type provided respectively on the plurality of second wells and separated from the first pillars by the second wells;

a control electrode opposing the first wells between the first pillars and the first impurity regions via an insulation film and opposing the second wells between the first pillars and the second impurity regions via the insulation film; and a second main electrode joined to each of the first wells, the second wells, the first impurity regions, and the second impurity regions.

2. The semiconductor device according to claim 1, wherein
the first wells extend to above the first pillars.

3. The semiconductor device according to claim 1, wherein
the first wells have edges on boundaries between the first pillars and the second pillars.

4. The semiconductor device according to claim 3, wherein
an impurity concentration in the first wells is the same as an impurity concentration in portions of the second pillars that are in contact with the first wells.

5. The semiconductor device according to claim 1, wherein
the first pillars and the second pillars are arranged in stripes in a layout that is parallel to the second surface of the semiconductor layer.

6. The semiconductor device according to claim 1, wherein
the second pillars have a plurality of pillar patterns as a layout that is parallel to the second surface of the semiconductor layer, and
the pillar patterns are arranged periodically along each of at least two directions.

7. The semiconductor device according to claim 6, wherein:
the at least two directions include two directions orthogonal to each other.

8. The semiconductor device according to claim 1, wherein
the second pillars have a plurality of pillar patterns as a layout that is parallel to the second surface of the semiconductor layer, and
the pillar patterns are arranged periodically along one direction and arranged in a staggered configuration in a direction perpendicular to the one direction.

9. The semiconductor device according to claim 1, wherein
the second wells are arranged in stripes in a layout that is parallel to the second surface of the semiconductor layer.

10. The semiconductor device according to claim 1, wherein
the second wells have a plurality of well patterns as a layout that is parallel to the second surface of the semiconductor layer, and
the well patterns are arranged periodically along each of at least two directions.

11. The semiconductor device according to claim 1, wherein
the second pillars have the same width and are arranged at regular intervals in the section.

12. The semiconductor device according to claim 1, wherein each of the second wells has a smaller width than each of the first wells in the section.

13. The semiconductor device according to claim 1, wherein
the superjunction layer is made of silicon carbide.

14. The semiconductor device according to claim 1, wherein
the first conductivity type is an n-type, and the second conductivity type is a p-type.

15. The semiconductor device according to claim 1, wherein
each of the plurality of first wells includes a first contact region extending from the second main electrode to the second pillar on which the first well is provided.

16. The semiconductor device according to claim 15, wherein
the first contact region is of the second conductivity type.

17. The semiconductor device according to claim 1, wherein
each of the plurality of second wells includes a second contact region extending from the second main electrode to the first pillar on which the second well is provided.

18. The semiconductor device according to claim 17, wherein
the second contact region is of the second conductivity type.

* * * * *